US012707854B2

(12) United States Patent
Park et al.

(10) Patent No.: US 12,707,854 B2
(45) Date of Patent: Aug. 11, 2026

(54) DISPLAY DEVICE AND DISPLAY PANEL

(71) Applicant: LG Display Co., Ltd., Seoul (KR)

(72) Inventors: SungJin Park, Paju-si (KR); Hyeonseo Kim, Paju-si (KR); HoYoung Lee, Paju-si (KR); SeungHyun Lee, Goyang-si (KR); Wontae Choe, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 376 days.

(21) Appl. No.: 18/471,929

(22) Filed: Sep. 21, 2023

(65) Prior Publication Data

US 2024/0130193 A1 Apr. 18, 2024

(30) Foreign Application Priority Data

Oct. 18, 2022 (KR) ........................ 10-2022-0134041

(51) Int. Cl.

*H10K 59/40* (2023.01)
*H10K 59/121* (2023.01)

(Continued)

(52) U.S. Cl.

CPC ......... *H10K 59/40* (2023.02); *H10K 59/1213* (2023.02); *H10K 59/131* (2023.02); *H10K 59/65* (2023.02)

(58) Field of Classification Search

CPC .. H10K 59/40; H10K 59/1213; H10K 59/131; H10K 59/65; H10K 59/352;

(Continued)

(56) References Cited

U.S. PATENT DOCUMENTS 7,936,121 B2 * 5/2011 Kim ........................ H10K 59/40 313/504
8,513,668 B2 * 8/2013 Hsu ...................... H10D 86/471 257/66

(Continued)

FOREIGN PATENT DOCUMENTS

KR 20200097371 A 8/2020
KR 20220027448 A 3/2022

(Continued)

*Primary Examiner* — Vu A Vu

(74) *Attorney, Agent, or Firm* — Seed Intellectual Property Law Group LLP

(57) ABSTRACT

The present disclosure provides a display panel and a display device that include a display area including a first optical area, a first optical bezel area located outside of the first optical area, and a normal area located outside of the first optical bezel area, and a non-display area, wherein each of the first optical area, the first optical bezel area, and the normal area may include two or more light emitting areas among a plurality of light emitting areas, and the first optical area may be a transmittable area. The plurality of light emitting areas may include a first light emitting area included in the first optical area, a second light emitting area emitting light of the same color as the first light emitting area and included in the first optical bezel area, and a third light emitting area emitting light of the same color as the first light emitting area and included in the normal area. The second light emitting area may have substantially the same area as each of the first and third light emitting areas.

19 Claims, 16 Drawing Sheets

(51) Int. Cl.
*H10K 59/131* (2023.01)
*H10K 59/65* (2023.01)

(58) Field of Classification Search
CPC ...... H10K 59/121; H10K 50/11; H10K 50/81; H10K 50/82; H10K 50/844; H10K 59/122; H10K 59/123; H10K 59/124; H10K 59/353; G06F 3/0412; G09F 9/30; G09F 9/33; G09F 9/335; G09F 9/35
USPC .......................................................... 257/40
See application file for complete search history.

(56) References Cited

U.S. PATENT DOCUMENTS

| | | | | |
|---|---|---|---|---|
| 9,437,840 | B2 * | 9/2016 | Choi | H10K 59/40 |
| 10,121,899 | B2 * | 11/2018 | Moon | H10D 30/6745 |
| 10,290,657 | B2 * | 5/2019 | Hanyu | H10D 30/6739 |
| 10,325,894 | B1 * | 6/2019 | Pan | H10D 86/60 |
| 10,452,221 | B2 * | 10/2019 | Kimura | G06F 3/04166 |
| 10,474,282 | B2 * | 11/2019 | Park | G06F 3/0416 |
| 10,797,088 | B2 * | 10/2020 | Takechi | H10D 86/471 |
| 11,296,149 | B2 * | 4/2022 | Hu | H10K 59/122 |
| 11,315,998 | B2 * | 4/2022 | Han | H10K 59/126 |
| 11,501,669 | B2 * | 11/2022 | Wu | G02B 5/3058 |
| 11,804,498 | B2 * | 10/2023 | Kawasaki | H10D 86/60 |
| 11,825,726 | B2 * | 11/2023 | Kubota | G02F 1/1333 |
| 11,989,064 | B2 * | 5/2024 | Lee | G06F 1/1637 |
| 12,350,913 | B2 * | 7/2025 | Wu | B32B 3/10 |
| 2019/0081089 | A1 * | 3/2019 | Cho | H10D 86/431 |
| 2022/0285461 | A1 * | 9/2022 | Hatsumi | H10K 59/40 |

FOREIGN PATENT DOCUMENTS

| | | | |
|---|---|---|---|
| KR | 20220031796 | A | 3/2022 |
| KR | 20220102194 | A | 7/2022 |
| KR | 20220111767 | A | 8/2022 |

* cited by examiner

DISPLAY DEVICE AND DISPLAY PANEL

CROSS-REFERENCE TO RELATED APPLICATION

This application claims the priority benefit of Republic of Korea Patent Application No. 10-2022-0134041, filed on Oct. 18, 2022, in the Korean Intellectual Property Office, which is incorporated herein by reference in its entirety.

BACKGROUND

Technical Field

The present disclosure relates to electronic devices, and more particularly, to a display device and a display panel including one or more optical electronic devices not exposed on front surfaces thereof.

Description of the Related Art

As display technology advances, display devices can provide increased functions, such as an image capture function, a sensing function, and the like, as well as an image display function. To provide these functions, a display device may need to include one or more optical electronic devices, such as a camera, a sensor for detecting an image, and the like.

In order to receive light passing through a front surface of a display device, it may be desirable for such an optical electronic device to be located in an area of the display device where incident light coming from the front surface can be increasingly received and detected. To achieve the foregoing, in a typical display device, an optical electronic device has been designed to be located in a front portion of the display device to allow a camera, a sensor, and/or the like as the optical electronic device to be increasingly exposed to incident light. In order to install an optical electronic device in a display device in this manner, a bezel area of the display device may be increased, or a notch or a hole may be needed to be formed in a display area of an associated display panel.

Therefore, as a display device needs an optical electronic device to receive or detect incident light, and perform an intended function, a size of the bezel in the front portion of the display device may be increased, or a substantial disadvantage may be encountered in designing the front portion of the display device.

BRIEF SUMMARY

The inventors have developed techniques for providing or placing one or more optical electronic devices in a display device without reducing an area of a display area of a display panel of the display device. Through the development, the inventors have invented a display panel and a display device that have a light transmission structure in which even when one or more optical electronic device are located under a display area of the display panel and are therefore not exposed in a front surface of the display device, the optical electronic device can receive light normally and increasingly.

One or more embodiments of the present disclosure can provide a display panel and a display device that include a light transmission structure for enabling one or more optical electronic devices to normally receive light (e.g., visible light, infrared light, ultraviolet light, or the like) while not being exposed in a front surface of the display device.

One or more embodiments of the present disclosure can provide a display panel and a display device that are capable of reducing or eliminating image quality non-uniformity that may occur between a transmittable optical area and a non-transmittable normal area.

One or more embodiments of the present disclosure can provide a display panel and a display device that, when a plurality of optical electronic devices are employed, include a plurality of optical areas that correspond to the plurality of optical electronic devices respectively, and more particularly, have respective distinct structures suitable for the plurality of optical electronic devices.

According to aspects of the present disclosure, a display device can be provided that includes a display area allowing one or more images to be displayed therein and including a plurality of light emitting areas, and a non-display area in which an image is not displayed.

The display area may include a first optical area, a first optical bezel area located outside of the first optical area, and a normal area located outside of the first optical bezel area.

Each of the first optical area, the first optical bezel area, and the normal area may include two or more light emitting areas among the plurality of light emitting areas.

The first optical area may be a transmittable area.

The plurality of light emitting areas may include a first light emitting area included in the first optical area, a second light emitting area emitting light of the same color as the first light emitting area and included in the first optical bezel area, and a third light emitting area emitting light of the same color as the first light emitting area and included in the normal area.

The second light emitting area may have the same or substantially or nearly the same area as each of the first light emitting area and the third light emitting area, or may have a different area within a predetermined range from each of the first light emitting area and the third light emitting area.

An arrangement of light emitting areas in the first optical area, an arrangement of light emitting areas in the first optical bezel area, and an arrangement of light emitting areas in the normal area may be the same or substantially or nearly the same as one another.

For example, the two or more light emitting areas included in each of the first optical area, the first optical bezel area, and the normal area may include a first color light emitting area emitting light of a first color, a second color light emitting area emitting light of a second color, and a third color light emitting area emitting light of a third color.

In each of the first optical area, the first optical bezel area, and the normal area, at least one of the first color light emitting area, the second color light emitting area, and the third color light emitting area may have a different area from the remaining one or more light emitting areas.

The first optical bezel area may be disposed only outside of an edge (or a portion of the edge) of the first optical area, or be disposed outside of the entire edge of the first optical area such that the first optical bezel area has a ring shape surrounding the first optical area.

Transistors may be disposed in the first optical bezel area and the normal area, and a transistor may not be disposed in the first optical area.

In one or more embodiments, the display device according to aspects of the present disclosure may further include a first light emitting element disposed in the first optical area and having the first light emitting area, a second light emitting element disposed in the first optical bezel area and having the second light emitting area, and a third light emitting element disposed in the normal area and having the third light emitting area, a first subpixel circuit configured to drive the first light emitting element, a second subpixel circuit configured to drive the second light emitting element, and a third subpixel circuit configured to drive the third light emitting element.

The second subpixel circuit may be disposed in the first optical bezel area where the second light emitting element is disposed, and the third subpixel circuit may be disposed in the normal area where the third light emitting element is disposed.

The first subpixel circuit may not be disposed in the first optical area where the first light emitting element is disposed, and instead, may be disposed in the first optical bezel area located outside of the first optical area.

In one or more embodiments, the display device according to aspects of the present disclosure may further include an anode extension line for electrically connecting the first light emitting element to the first subpixel circuit.

In one or more embodiments, in the display device according to aspects of the present disclosure, all or a portion of the anode extension line may be disposed in the first optical area.

In one or more embodiments, in the display device according to aspects of the present disclosure, the anode extension line may include a transparent material.

In one or more embodiments, the display device according to aspects of the present disclosure may further includes a first anode electrode disposed in the first optical area, a second anode electrode disposed in the first optical bezel area, a third anode electrode disposed in the normal area, and a cathode electrode commonly disposed in the first optical area, the first optical bezel area, and the normal area as a common electrode.

The first light emitting element may be configured with the first anode electrode and the cathode electrode, the second light emitting element may be configured with the second anode electrode and the cathode electrode, and the third light emitting element may be configured with the third anode electrode and the cathode electrode.

The cathode electrode may include a plurality of cathode holes located in the first optical area.

According to aspects of the present disclosure, a display panel can be provided that includes a first optical area, a first optical bezel area located outside of the first optical area, and a normal area located outside of the first optical bezel area, and includes a display area in which one or more images are displayed, and a non-display area in which an image is not displayed.

Each of the first optical area, the first optical bezel area, and the normal area may include a plurality of light emitting areas.

The first optical area may include a plurality of transmission areas.

The first optical area may include a first light emitting element having a first light emitting area.

The first optical bezel area may include a second light emitting element having a second light emitting area.

The first optical bezel area may further include a first subpixel circuit configured to drive the first light emitting element and a second subpixel circuit configured to drive the second light emitting element.

The display panel may further include an anode extension line for electrically connecting the first light emitting element in the first optical area to the first subpixel circuit in the first optical bezel area.

All or a portion of the anode extension line may overlap the first optical area, and may include a transparent material, or be or include a transparent line.

The normal area may include a third light emitting element having a third light emitting area and a third subpixel circuit configured to drive the third light emitting element.

In an example where the first light emitting element, the second light emitting element, and the third light emitting element emit light of a same color, the third light emitting area may have the same or substantially or nearly the same area as each of the first light emitting area and the second light emitting area, or may have a different area within a predetermined range from each of the first light emitting area and the second light emitting area.

According to one or more embodiments of the present disclosure, a display panel and a display device can be provided that include a light transmission structure for enabling one or more optical electronic devices to normally receive light (e.g., visible light, infrared light, ultraviolet light, or the like) while not being exposed in a front surface of the display device.

According to one or more embodiments of the present disclosure, a display panel and a display device can be provided that are capable of reducing or eliminating image quality non-uniformity that may occur between an optical area and a normal area by designing respective light emitting areas of the transmittable optical area and the non-transmittable normal area to have different structures.

According to one or more embodiments of the present disclosure, a display panel and a display device can be provided that, when a plurality of optical electronic devices are employed, include a plurality of optical areas corresponding to the plurality of optical electronic devices respectively, and more particularly, having respective distinct structures suitable for the plurality of optical electronic devices.

According to one or more embodiments of the present disclosure, a display panel and a display device can be provided that include a cathode electrode with a plurality of cathode holes located in an optical area, and thereby, increasingly improve the transmittance of the optical area while preventing an area or element adjacent to the cathode holes from being damaged or varied in the process of forming the cathode holes.

Additional features and aspects will be set forth in part in the description which follows and in part will become apparent from the description or may be learned by practice of the inventive concepts provided herein. Other features and aspects of the inventive concepts may be realized and attained by the structure particularly pointed out in, or derivable from, the written description, the claims hereof, and the appended drawings.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the appended claims. Nothing in this section should be taken as a limitation on those claims.

It is to be understood that both the foregoing general description and the following detailed description of the present disclosure are illustrative examples and explanatory and are intended to provide further explanation of the inventive concepts.

BRIEF DESCRIPTION OF THE SEVERAL VIEWS OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings.

DETAILED DESCRIPTION

Figure 1A:
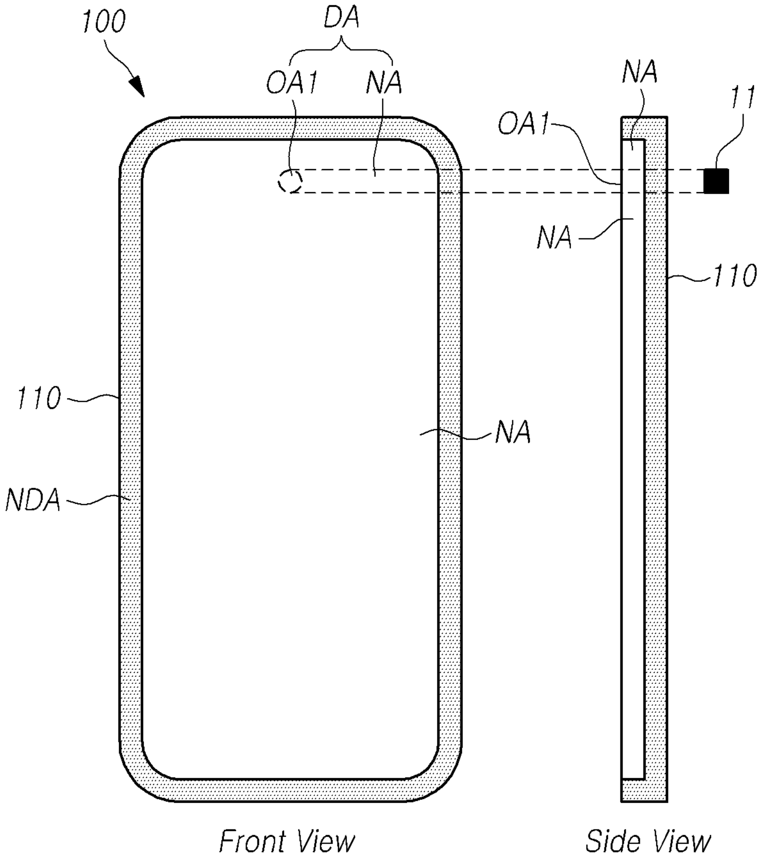
FIGS. 1A, 1B, and 1C illustrate an example display device according to aspects of the present disclosure.

Reference will now be made in detail to embodiments of the present disclosure, examples of which may be illustrated in the accompanying drawings. In the following description, structures, embodiments, implementations, methods and operations described herein are not limited to the specific example or examples set forth herein and may be changed as is known in the art, unless otherwise specified. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

Shapes, sizes, ratios, angles, numbers, and the like, which are illustrated in the drawings to describe various example embodiments of the present disclosure are merely given by way of example. Therefore, the present disclosure is not limited to the illustrations in the drawings. Like reference numerals designate like elements throughout, unless otherwise specified. Names of the respective elements used in the following explanations are selected only for convenience of writing the specification and may thus be different from those used in actual products. In the following description, where the detailed description of the relevant known function or configuration may unnecessarily obscure aspects of the present disclosure, a detailed description of such known function or configuration may be omitted. Where the terms "comprise," "have," "include," "contain," "constitute," "make up of," "formed of," and the like are used, one or more other elements may be added unless the term, such as "only," is used. An element described in the singular form is intended to include a plurality of elements, and vice versa, unless the context clearly indicates otherwise.

In construing an element, the element is to be construed as including an error or tolerance range even where no explicit description of such an error or tolerance range is provided. Further, the term "may" fully encompasses all the meanings of the term "can."

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom, "downward," "upward," "upper," "lower," and the like refer to an arbitrary frame of reference. For the expression that an element or layer "contacts," "overlaps," or the like with another element or layer, the element or layer can not only directly contact, overlap, or the like with another element or layer, but indirectly contact, overlap, or the like with another element or layer with one or more intervening elements or layers "disposed" or "interposed" between the elements or layers, unless otherwise specified.

Time relative terms, such as "after," "subsequent to," "next to," "before," or the like, used to describe a temporal relationship between events, operations, or the like are generally intended to include events, situations, cases, operations, or the like that do not occur consecutively unless the terms, such as "directly," "immediately," or the like, are used.

In describing a temporal relationship, when the temporal order is described as, for example, "after," "subsequent," "next," or "before," a case which is not continuous may be included unless a more limiting term, such as "just," "immediate(ly)," or "direct(ly)," is used.

Although the terms "first," "second," A, B, (a), (b), and the like may be used herein to describe various elements, these elements should not be interpreted to be limited by these terms as they are not used to define a particular order precedence. These terms are used only to distinguish one element from another. For example, a first element could be termed a second element, and, similarly, a second element could be termed a first element, without departing from the scope.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers "disposed" or "interposed" between the elements or layers, unless otherwise specified. The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element. The expression of a first element, a second elements "and/or" a third element should be understood as one of the first, second and third elements or as any or all combinations of the first, second and third elements. By way of example, A, B and/or C can refer to only A, only B, or only C; any or some combination of A, B, and C; or all of A, B, and C.

Hereinafter, various example embodiments of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings. In describing example embodiments of the present disclosure, equated or corresponding elements or configurations as embodiment previously described will not be repeatedly discussed. Discussions on example embodiments of the present disclosure are provided below.

Figure 1B:
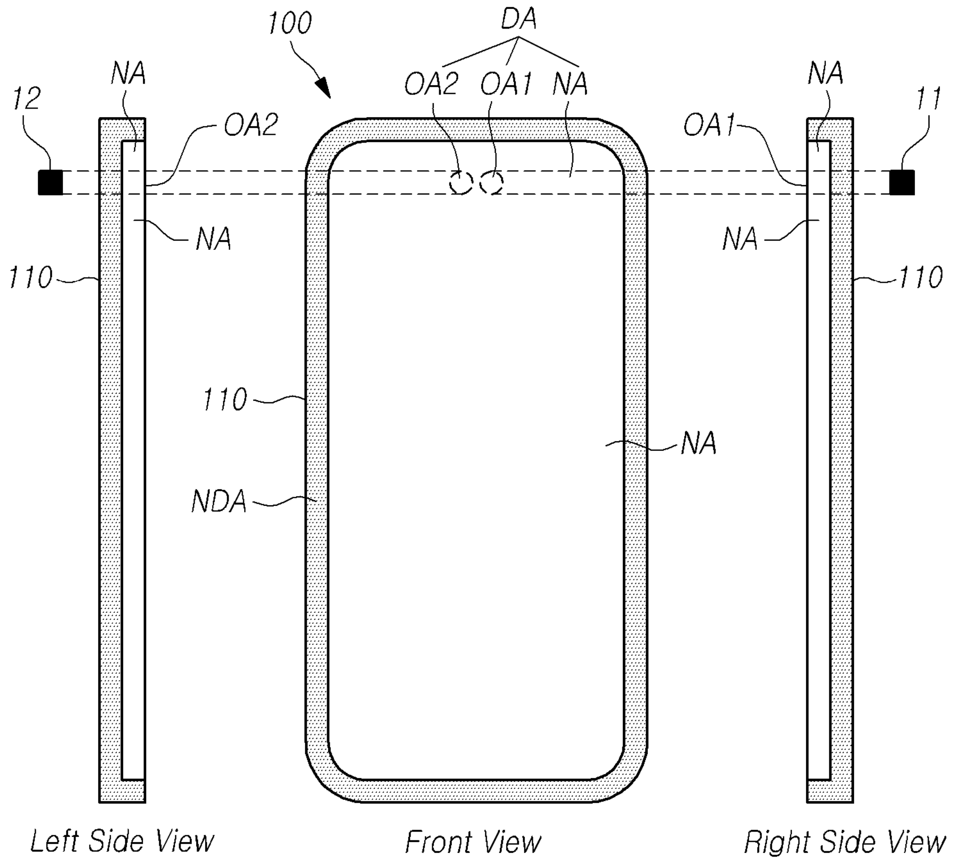
Figure 1C:
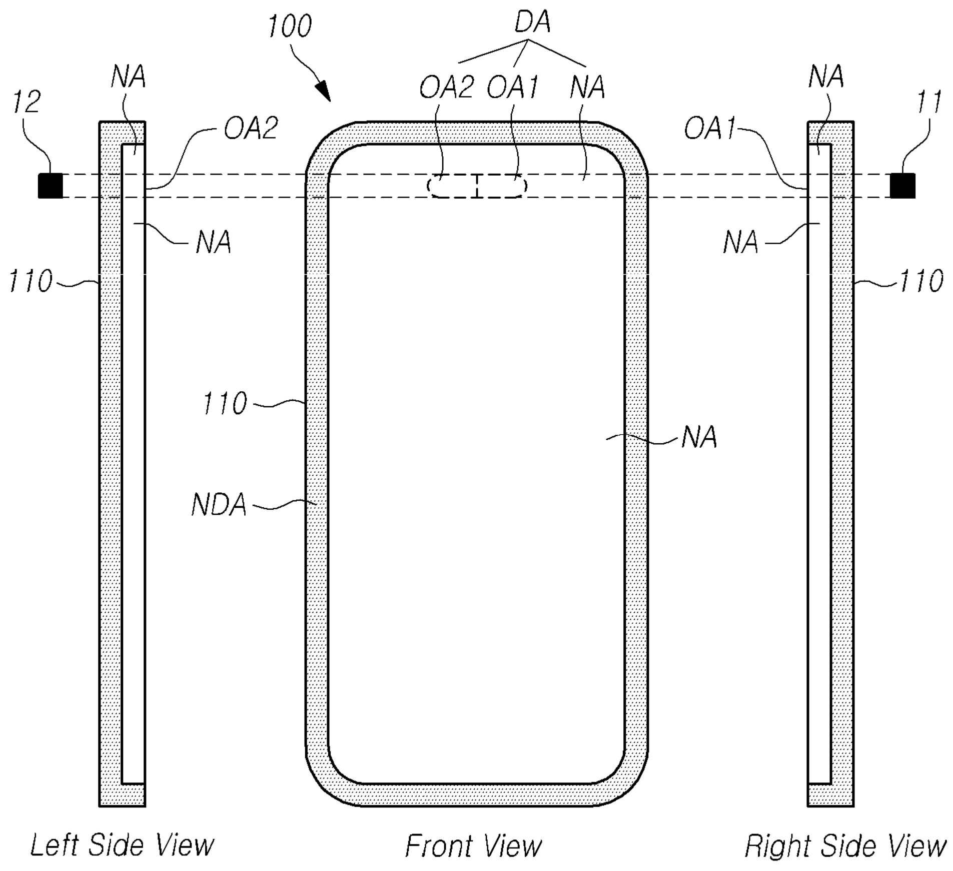

FIGS. 1A, 1B, and 1C illustrate an example display device according to aspects of the present disclosure.

Referring to FIGS. 1A, 1B, and 1C, a display device 100 according to aspects of the present disclosure may include a display panel 110 for displaying one or more images, and one or more optical electronic devices (11 and/or 12). Herein, examples of an optical electronic device may include but not limited to a light detector, a light receiver, or a light sensing device. An optical electronic device may include one or more of a camera, a camera lens, a sensor, a sensor for detecting images, or the like.

The display panel 110 may include a display area DA in which one or more images are displayed and a non-display area NDA in which an image is not displayed.

A plurality of subpixels may be arranged in the display area DA, and several types of signal lines for driving the plurality of subpixels may be arranged therein.

The non-display area NDA may refer to an area outside of the display area DA. Several types of signal lines may be arranged in the non-display area NDA, and several types of driving circuits may be connected thereto. At least a portion of the non-display area NDA may be bent to be invisible from the front surface of the display device 100 or may be covered by a case or housing (not shown) of the display device 100. The non-display area NDA may be also referred to as a bezel or a bezel area.

Referring to FIGS. 1A, 1B, and 1C, in the display device 100 according to aspects of the present disclosure, one or more optical electronic devices (11 and/or 12) may be prepared independently of, and installed in, the display panel 110, and be located under, or in a lower portion of, the display panel 110 (an opposite side of a viewing surface thereof).

Light can enter the front surface (the viewing surface) of the display panel 110, pass through the display panel 110, reach one or more optical electronic devices (11 and/or 12) located under, or in the lower portion of, the display panel 110 (the opposite side of the viewing surface). Light passing through the display panel 110 may include, for example, visible light, infrared light, or ultraviolet light.

The one or more optical electronic devices (11 and/or 12) may be devices configured to receive or detect light transmitting the display panel 110 and perform a function based on the received light. For example, the one or more optical electronic devices (11 and/or 12) may comprise one or more of the following: an image capture device such as a camera (an image sensor), and/or the like; or a sensor such as a proximity sensor, an illuminance sensor, and/or the like. Such a sensor may be, for example, an infrared sensor capable of detecting infrared light.

Referring to FIGS. 1A, 1B, and 1C, in the display panel 110 according to aspects of the present disclosure, the display area DA may include one or more optical areas (OA1 and/or OA2) and a normal area NA. Herein, the term "normal area" NA is an area that while being present in the display area DA, does not overlap with one or more optical electronic devices (11 and/or 12) and may also be referred to as a non-optical area. The one or more optical areas (OA1 and/or OA2) may be one or more areas overlapping the one or more optical electronic devices (11 and/or 12) in a cross-sectional view of the display panel 110.

According to an example of FIG. 1A, the display area DA may include a first optical area OA1 and a normal area NA. In this example, at least a portion of the first optical area OA1 may overlap a first optical electronic device 11.

According to an example of FIG. 1B, the display area DA may include a first optical area OA1, a second optical area OA2, and a normal area NA. In this example, a portion of the normal area NA may be present between the first optical area OA1 and the second optical area OA2. At least a portion of the first optical area OA1 may overlap the first optical electronic device 11, and at least a portion of the second optical area OA2 may overlap a second optical electronic device 12.

According to an example of FIG. 1C, the display area DA may include a first optical area OA1, a second optical area OA2, and a normal area NA. In this example, the normal area NA may not be present between the first optical area OA1 and the second optical area OA2. For example, the first optical area OA1 and the second optical area OA2 may contact each other (e.g., directly contact each other). In this example, at least a portion of the first optical area OA1 may overlap the first optical electronic device 11, and at least a portion of the second optical area OA2 may overlap the second optical electronic device 12.

In the display panel 110 or the display device 100 according to aspects of the present disclosure, it may be desirable that both an image display structure and a light transmission structure are implemented in the one or more optical areas (OA1 and/or OA2). For example, since the one or more optical areas (OA1 and/or OA2) are portions of the display area DA, it is therefore desirable that light emitting areas of subpixels for displaying one or more images are disposed in the one or more optical areas (OA1 and/or OA2). Further, to enable light to transmit the one or more optical electronic devices (11 and/or 12), it may be desirable that a light transmission structure is implemented in the one or more optical areas (OA1 and/or OA2).

It should be noted that even though the one or more optical electronic devices (11 and/or 12) are devices that need to receive light, the one or more optical electronic devices (11 and/or 12) may be located on the back of the display panel 110 (e.g., on an opposite side of the viewing surface thereof), and thereby, can receive light that has transmitted the display panel 110. For example, the one or more optical electronic devices (11 and/or 12) may not be exposed in the front surface (viewing surface) of the display panel 110 or the display device 100. Accordingly, when a user faces the front surface of the display device 100, the one or more optical electronic devices (11 and/or 12) are located so that they are not visible to the user.

The first optical electronic device 11 may be, for example, a camera, and the second optical electronic device 12 may be, for example, a sensor. The sensor may be a proximity sensor, an illuminance sensor, an infrared sensor, and/or the like. In one or more embodiments, the camera may be a camera lens, an image sensor, or a unit including at least one of the camera lens and the image sensor, and the sensor may be an infrared sensor capable of detecting infrared light. In another embodiment, the first optical electronic device 11 may be a sensor, and the second optical electronic device 12 may be a camera.

Hereinafter, for convenience of descriptions related to the optical electronic devices (11 and 12), the first optical electronic device 11 is considered to be a camera, and the second optical electronic device 12 is considered to be an infrared sensor. It should be, however, understood that the scope of the present disclosure includes examples where the first optical electronic device 11 is an infrared sensor, and the second optical electronic device 12 is a camera. The camera may be, for example, a camera lens, an image sensor, or a unit including at least one of the camera lens and the image sensor.

In an example where the first optical electronic device 11 is a camera, this camera may be located on the back of (e.g., under, or in a lower portion of) the display panel 110, and be a front camera capable of capturing objects or images in a front direction of the display panel 110. Accordingly, the user can capture an image or object through the camera that is invisible on the viewing surface while looking at the viewing surface of the display panel 110.

Although the normal area NA and the one or more optical areas (OA1 and/or OA2) included in the display area DA in each of FIGS. 1A, 1B, and 1C are areas where images can be displayed, the normal area NA is an area where a light transmission structure need not be implemented, but the one or more optical areas (OA1 and/or OA2) are areas where a light transmission structure need be implemented. Thus, in one or more embodiments, the normal area NA is an area where a light transmission structure is not implemented or included, and the one or more optical areas (OA1 and/or OA2) are areas in which a light transmission structure is implemented or included.

Accordingly, the one or more optical areas (OA1 and/or OA2) can have a transmittance greater than or equal to a predetermined level, i.e., a relatively high transmittance, and the normal area NA can have a transmittance less than the predetermined level, i.e., a relatively low transmittance or not have light transmittance.

For example, the one or more optical areas (OA1 and/or OA2) may have a resolution, a subpixel arrangement structure, the number of subpixels per unit area, an electrode structure, a line structure, an electrode arrangement structure, a line arrangement structure, and/or the like different from that/those of the normal area NA.

In one embodiment, the number of subpixels per unit area in the one or more optical areas (OA1 and/or OA2) may be less than the number of subpixels per unit area in the normal area NA. For example, the resolution of the one or more optical areas (OA1 and/or OA2) may be lower than that of the normal area NA. In this example, the number of subpixels per unit area may have the same meaning as a resolution, a pixel density, or a degree of integration of pixels. For example, the unit of the number of subpixels per unit area may be pixels per inch (PPI), which represents the number of pixels within 1 inch.

In the examples of FIGS. 1A, 1B, and 1C, the number of subpixels per unit area in the first optical areas OA1 may be less than the number of subpixels per unit area in the normal area NA. In the examples of FIGS. 1A, 1B, and 1C, the number of subpixels per unit area in the second optical areas OA2 may be greater than or equal to the number of subpixels per unit area in the first optical areas OA1, and be less than the number of subpixels per unit area in the normal area NA.

In one or more embodiments, as a method for increasing a transmittance of at least one of the first optical area OA1 and the second optical area OA2, a technique (which may be referred to as a "pixel density differentiation design scheme") may be applied so that a density of pixels (or subpixels) or a degree of integration of pixels (or subpixels) can be differentiated as described above. According to the pixel density differentiation design scheme, in an embodiment, the display panel 110 may be configured or designed such that the number of subpixels per unit area of at least one of the first optical area OA1 and the second optical area OA2 is less than the number of subpixels per unit area of the normal area NA.

In one or more embodiments, as another method for increasing a transmittance of at least one of the first optical area OA1 and the second optical area OA2, a technique (which may be referred to as a "pixel size differentiation design scheme") may be applied so that a size of a pixel (or a subpixel) can be differentiated. According to the pixel size differentiation design scheme, the display panel 110 may be configured or designed such that the number of subpixels per unit area of at least one of the first optical area OA1 and the second optical area OA2 is equal to or similar to the number of subpixels per unit area of the normal area NA; however, a size of each subpixel (i.e., a size of a corresponding light emitting area) disposed in at least one of the first optical area OA1 and the second optical area OA2 is smaller than a size of each subpixel (i.e., a size of a corresponding light emitting area) disposed in the normal area NA.

In one or more aspects, for convenience of description, discussions that follow are provided based on the pixel density differentiation design scheme of the two schemes (i.e., the pixel density differentiation design scheme and the pixel size differentiation design scheme) for increasing the transmittance of at least one of the first optical area OA1 and the second optical area OA2, unless explicitly stated otherwise. It should be therefore understood that in descriptions that follow, a small number of subpixels per unit area may be considered as corresponding to a small size of subpixel, and a large number of subpixels per unit area may be considered as corresponding to a large size of subpixel.

In the examples of FIGS. 1A, 1B, and 1C, the first optical area OA1 may have various shapes, such as a circle, an ellipse, a quadrangle, a hexagon, an octagon or the like. In the examples of FIGS. 1B and 1C, the second optical area OA2 may have various shapes, such as a circle, an ellipse, a quadrangle, a hexagon, an octagon or the like. The first optical area OA1 and the second optical area OA2 may have the same or substantially or nearly the same shape, or different shapes.

Referring to FIG. 1C, in the example where the first optical area OA1 and the second optical area OA2 contact each other (e.g., directly contact each other), the entire optical area including the first optical area OA1 and the second optical area OA2 may also have various shapes, such as a circle, an ellipse, a quadrangle, a hexagon, an octagon or the like. Hereinafter, for convenience of descriptions related to shapes of the optical areas (OA1 and OA2), each of the first optical area OA1 and the second optical area OA2 is considered to have a circular shape. It should be, however, understood that the scope of the present disclosure includes examples where at least one of the first optical area OA1 and the second optical area OA2 have a shape other than a circular shape.

According to one or more aspects of the present disclosure, when the display device 100 has a structure in which the first optical electronic device 11 such as a camera, and the like is located under, or in a lower portion of, the display panel 100 without being exposed to the outside, such a display device may be referred to as a display in which a under-display camera (UDC) technology is implemented.

The display device 100 in which such a under-display camera (UDC) technology is implemented can provide an advantage of preventing an reduction of an area or size of the display area DA because a notch or a camera hole for exposing a camera need not be formed in the display panel 110. Indeed, since the notch or the camera hole for camera exposure need not be formed in the display panel 110, the display device 100 can provide further advantages of reducing the size of the bezel area, and improving the degree of freedom in design because such limitations to the design are removed.

Although the one or more optical electronic devices (11 and/or 12) are located on the back of (e.g., under, or in a lower portion of) the display panel 110 of the display device 100 (e.g., hidden or not exposed to the outside), the one or more optical electronic devices (11 and/or 12) are required to perform their normal functionalities by receiving or detecting light.

Further, although one or more optical electronic devices (11 and/or 12) are located on the back of (e.g., under, or in a lower portion of) the display panel 110 to be hidden and located to be overlap the display area DA, it is desirable that the display device 100 is configured to normally display one or more images in the one or more optical areas (OA1 and/or OA2) overlapping the one or more optical electronic devices (11 and/or 12) in the display area DA. Thus, even though one or more optical electronic devices (11 and/or 12) are located on the back of the display panel, the display device 100 according to aspects of the present disclosure can be configured to display images in a normal manner (e.g., without reduction in image quality) in the one or more optical areas (OA1 and/or OA2) overlapping the one or more optical electronic devices (11 and/or 12) in the display area DA.

Since the foregoing first optical area OA1 is configured or designed as a transmittable area, the quality of image display in the first optical area OA1 may be different from the quality of image display in the normal area NA.

Further, when designing the first optical area OA1 for the purpose of improving the quality of image display, there may be caused a situation that the transmittance of the first optical area OA1 is reduced.

To address these issues, in one or more aspects, the first optical area OA1 included in the display device 100 or the display panel may be configured with, or include, a structure capable of preventing a difference (e.g., non-uniformity) in image quality between the first optical area OA1 and the normal area NA from being caused, and improving the transmittance of the first optical area OA1.

Further, not only the first optical area OA1, but the second optical area OA2 included in the display device 100 or the display panel 110 according to aspects of the present disclosure may be configured with, or include, a structure capable of improving the image quality of the second optical area OA2, and improving the transmittance of the second optical area OA2.

It should be also noted that the first optical area OA1 and the second optical area OA2 included in the display device 100 or the display panel 110 according to aspects of the present disclosure may be differently implemented or have different utilization examples while having a similarity in terms of light transmittable areas. Taking account of such a distinction, the structure of the first optical area OA1 and the structure of the second optical area OA2 in the display device 100 according to aspects of the present disclosure may be configured or designed differently from each other.

Figure 2:
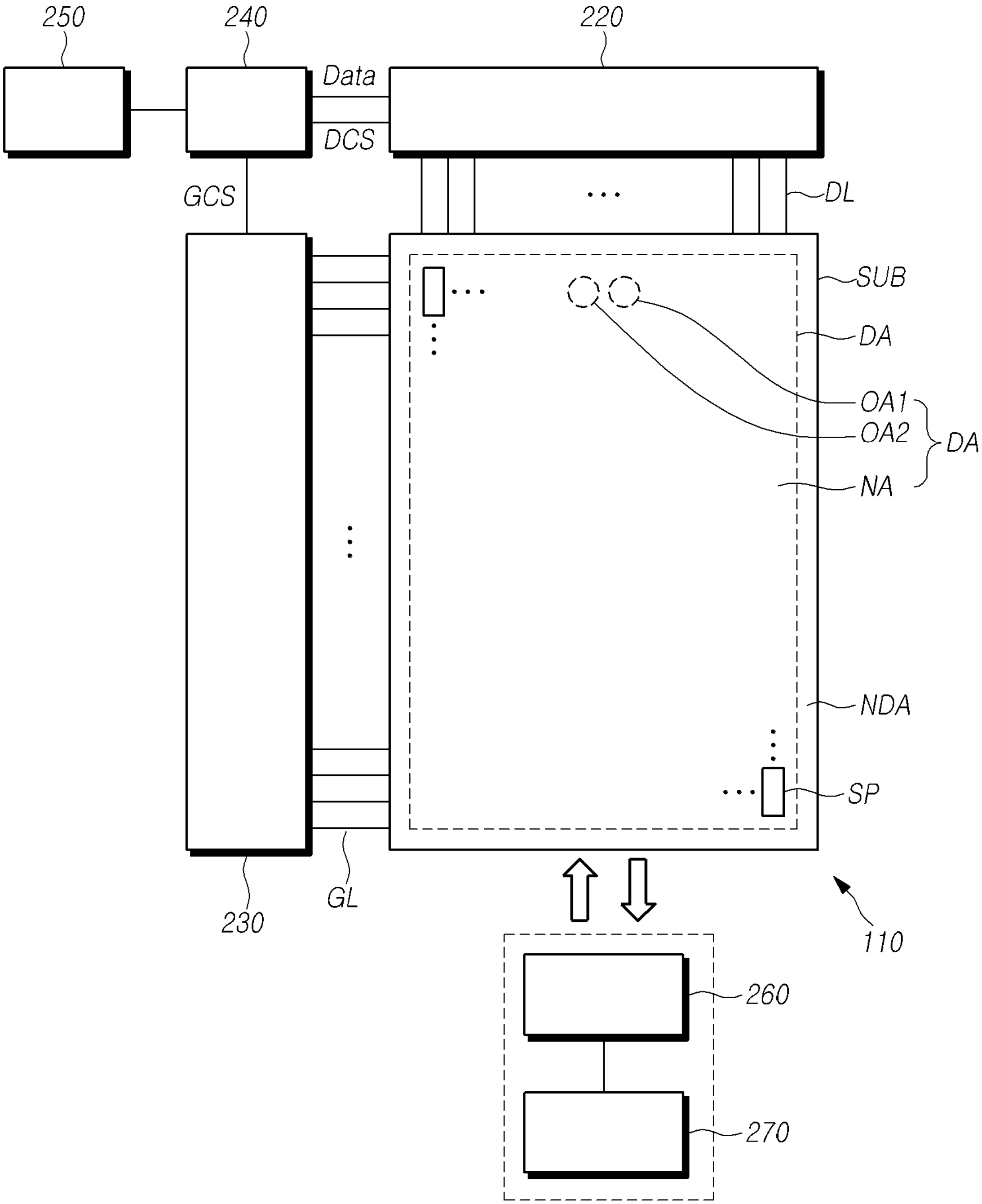
FIG. 2 illustrates an example system configuration of the display device according to aspects of the present disclosure.

FIG. 2 illustrates an example system configuration of the display device 100 according to aspects of the present disclosure.

FIG. 2 illustrates an example system configuration of the display device 100 according to aspects of the present disclosure. Referring to FIG. 2, the display device 100 may include the display panel 110 and a display driving circuit as components for displaying one or more images.

The display driving circuit is a circuit for driving the display panel 110, and may include a data driving circuit 220, a gate driving circuit 230, a display controller 240, and other components.

The display panel 110 may include a display area DA in which one or more images are displayed and a non-display area NDA in which an image is not displayed. The non-display area NDA may be an area outside of the display area DA, and may also be referred to as an edge area or a bezel area. All or a portion of the non-display area NDA may be an area visible from the front surface of the display device 100, or an area that is bent and invisible from the front surface of the display device 100.

The display panel 110 may include a substrate SUB and a plurality of subpixels SP disposed on the substrate SUB. The display panel 110 may further include various types of signal lines to drive the plurality of subpixels SP.

The display device 100 according to aspects of the present disclosure may be a liquid crystal display device, or the like, or a self-emission display device in which light is emitted from the display panel 110 itself. In the example where the display device 100 according to aspects of the present disclosure is implemented as a self-emission display device, each of the plurality of subpixels SP may include a light emitting element. For example, the display device 100 according to aspects of the present disclosure may be an organic light emitting display device implemented with one or more organic light emitting diodes (OLED). In another example, the display device 100 according to aspects of the present disclosure may be an inorganic light emitting display device implemented with one or more inorganic material-based light emitting diodes. In further another example, the display device 100 according to aspects of the present disclosure may be a quantum dot display device implemented with quantum dots, which are self-emission semiconductor crystals.

The structure of each of the plurality of subpixels SP may be differently configured or designed according to types of the display devices 100. For example, in an example where the display device 100 is a self-emission display device including self-emission subpixels SP, each subpixel SP may include a self-emission light emitting element, one or more transistors, and one or more capacitors.

In one or more embodiments, various types of signal lines arranged in the display device 100 may include, for example, a plurality of data lines DL for carrying data signals (which may be referred to as data voltages or image signals), a plurality of gate lines GL for carrying gate signals (which may be referred to as scan signals), and the like.

The plurality of data lines DL and the plurality of gate lines GL may intersect each other. Each of the plurality of data lines DL may extend in a first direction. Each of the plurality of gate lines GL may extend in a second direction different from the first direction. For example, the first direction may be a column or vertical direction, and the second direction may be a row or horizontal direction. In another example, the first direction may be the row or horizontal direction, and the second direction may be the column or vertical direction.

The data driving circuit 220 may be a circuit for driving the plurality of data lines DL, and can supply data signals to the plurality of data lines DL. The gate driving circuit 230 may be a circuit for driving the plurality of gate lines GL, and can supply gate signals to the plurality of gate lines GL.

The display controller 240 may be a device for controlling the data driving circuit 220 and the gate driving circuit 230, and can control driving timing for the plurality of data lines DL and driving timing for the plurality of gate lines GL.

The display controller 240 can supply a data driving control signal DCS to the data driving circuit 220 to control the data driving circuit 220, and supply a gate driving control signal GCS to the gate driving circuit 230 to control the gate driving circuit 230.

The display controller 240 can receive input image data from a host system 250 and supply image data Data to the data driving circuit 220 based on the input image data.

The data driving circuit 220 can receive the digital image data Data from the display controller 240, convert the received image data Data into analog data signals, and supply the resulting analog data signals to the plurality of data lines DL.

The gate driving circuit 230 can receive a first gate voltage corresponding to a turn-on level voltage and a second gate voltage corresponding to a turn-off level voltage along with various gate driving control signals GCS, generate gate signals, and supply the generated gate signals to the plurality of gate lines GL.

In one or more embodiments, the data driving circuit 220 may be connected to the display panel 110 in a tape automated bonding (TAB) type, or connected to a conductive pad such as a bonding pad of the display panel 110 in a chip on glass (COG) type or a chip on panel (COP) type, or connected to the display panel 110 in a chip on film (COF) type.

In one or more embodiments, the gate driving circuit 230 may be connected to the display panel 110 in the tape automated bonding (TAB) type, or connected to a conductive pad such as a bonding pad of the display panel 110 in the chip on glass (COG) type or the chip on panel (COP) type, or connected to the display panel 110 in the chip on film (COF) type. In another embodiment, the gate driving circuit 230 may be disposed in the non-display area NDA of the display panel 110 in a gate in panel (GIP) type. The gate driving circuit 230 may be disposed on or over the substrate, or connected to the substrate. That is, in the case of the GIP type, the gate driving circuit 230 may be disposed in the non-display area NDA of the substrate. In the case of the chip on glass (COG) type, the chip on film (COF) type, or the like, the gate driving circuit 230 may be connected to the substrate.

In one or more embodiments, at least one of the data driving circuit 220 and the gate driving circuit 230 may be disposed in the display area DA of the display panel 110. For example, at least one of the data driving circuit 220 and the gate driving circuit 230 may be disposed such that it does not overlap subpixels SP, or disposed such that it overlaps one or more, or all, of the subpixels SP, or at least respective one or more portions of one or more subpixels.

The data driving circuit 220 may be located on, but not limited to, only one side or portion (e.g., an upper edge or a lower edge) of the display panel 110. In one or more embodiments, the data driving circuit 220 may be located in, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 230 may be located in only one side or portion (e.g., a left edge or a right edge) of the display panel 110. In one or more embodiments, the gate driving circuit 230 may be connected to two sides or portions (e.g., a left edge and a right edge) of the display panel 110, or be connected to at least two of four sides or portions (e.g., an upper edge, a lower edge, the left edge, and the right edge) of the display panel 110 according to driving schemes, panel design schemes, or the like.

The display controller 240 may be implemented in a separate component from the data driving circuit 220, or integrated with the data driving circuit 220 and thus implemented in an integrated circuit.

The display controller 240 may be a timing controller used in the typical display technology or a controller or a control device capable of performing other control functions in addition to the function of the typical timing controller. In one or more embodiments, the display controller 140 may be a controller or a control device different from the timing controller, or a circuitry or a component included in the controller or the control device. The display controller 240 may be implemented with various circuits or electronic components such as an integrated circuit (IC), a field programmable gate array (FPGA), an application specific integrated circuit (ASIC), a processor, and/or the like.

The display controller 240 may be mounted on a printed circuit board, a flexible printed circuit, and/or the like and be electrically connected to the gate driving circuit 220 and the data driving circuit 230 through the printed circuit board, flexible printed circuit, and/or the like.

The display controller 240 may transmit signals to, and receive signals from, the data driving circuit 220 via one or more interfaces. For example, such interfaces may include a low voltage differential signaling (LVDS) interface, an embedded clock point-point (EPI) interface, a serial peripheral interface (SPI), and the like.

In order to further provide a touch sensing function, as well as an image display function, the display device 100 according to aspects of the present disclosure may include at least one touch sensor, and a touch sensing circuit capable of detecting whether a touch event occurs by a touch object such as a finger, a pen, or the like, or of detecting a corresponding touch position, by sensing the touch sensor.

The touch sensing circuit may include: a touch driving circuit 260 capable of generating and providing touch sensing data by driving and sensing the touch sensor; a touch controller 270 capable of detecting the occurrence of a touch event or detecting a touch position using the touch sensing data; and one or more other components.

The touch sensor may include a plurality of touch electrodes. The touch sensor may further include a plurality of touch lines for electrically connecting the plurality of touch electrodes to the touch driving circuit 260.

The touch sensor may be implemented in a touch panel, or in the form of a touch panel, outside of the display panel 110, or be implemented inside of the display panel 110. In the example where the touch sensor is implemented in the touch panel, or in the form of the touch panel, outside of the display panel 110, such a touch sensor is referred to as an add-on type. In the example where such an add-on type of touch sensor is disposed, the touch panel and the display panel 110 may be separately manufactured and coupled during an assembly process. The add-on type of touch panel may include a touch panel substrate and a plurality of touch electrodes on the touch panel substrate.

In order to have the touch sensor implemented inside of the display panel 110, a process of manufacturing the display panel 110 may include disposing the touch sensor over the substrate SUB together with signal lines and electrodes related to driving the display device 100.

The touch driving circuit 260 can supply a touch driving signal to at least one of the plurality of touch electrodes, and sense at least one of the plurality of touch electrodes to generate touch sensing data.

The touch sensing circuit can perform touch sensing using a self-capacitance sensing technique or a mutual-capacitance sensing technique.

In the example where the touch sensing circuit performs touch sensing in the self-capacitance sensing technique, the touch sensing circuit can perform touch sensing based on capacitance between each touch electrode and a touch object (e.g., a finger, a pen, and the like). According to the self-capacitance sensing technique, each of the plurality of touch electrodes can serve as both a driving touch electrode and a sensing touch electrode. The touch driving circuit 260 can drive all, or one or more, of the plurality of touch electrodes and sense all, or one or more, of the plurality of touch electrodes.

In the example where the touch sensing circuit performs touch sensing in the mutual-capacitance sensing technique, the touch sensing circuit can perform touch sensing based on capacitance between touch electrodes. According to the mutual-capacitance sensing technique, the plurality of touch electrodes are divided into driving touch electrodes and sensing touch electrodes. The touch driving circuit 260 can drive the driving touch electrodes and sense the sensing touch electrodes.

The touch driving circuit 260 and the touch controller 270 included in the touch sensing circuit may be implemented in separate devices or in a single device. Further, the touch driving circuit 260 and the data driving circuit 220 may be implemented in separate devices or in a single device.

The display device 100 may further include a power supply circuit for supplying various types of power to the display driving circuit and/or the touch sensing circuit.

The display device 100 according to aspects of the present disclosure may represent, but not limited to, a mobile terminal such as a smart phone, a tablet, or the like, or a monitor, a television (TV), or the like. Such devices may be of various types, sizes, and shapes. The display device 100 according to embodiments of the present disclosure are not limited thereto, and includes displays of various types, sizes, and shapes for displaying information or images.

As described above, the display area DA of the display panel 110 may include the normal area NA and the one or more optical areas (OA1 and/or OA2) as illustrated in FIGS. 1A, 1B, and 1C. The normal area NA and the one or more optical areas (OA1 and/or OA2) may be areas where one or more images can be displayed. It should be noted here that the normal NA may be an area in which a light transmission structure need not be implemented, and the one or more optical areas (OA1 and/or OA2) may be areas in which a light transmission structure need be implemented.

As discussed above with respect to the examples of FIGS. 1A, 1B, and 1C, even though the display area DA of the display panel 110 may include the one or more optical areas (OA1 and/or OA2) together with the normal area NA, for convenience of description, discussions that follow will be provided based on embodiments where the display area DA includes both the first and second optical areas OA1 and OA2 (i.e., the first optical area OA1 of FIGS. 1A, 1B, and 1C, and the second optical area OA2 of FIGS. 1B and 1C) and the normal area NA (i.e., the normal area NA of FIGS. 1A, 1B, and 1C).

Figure 3:
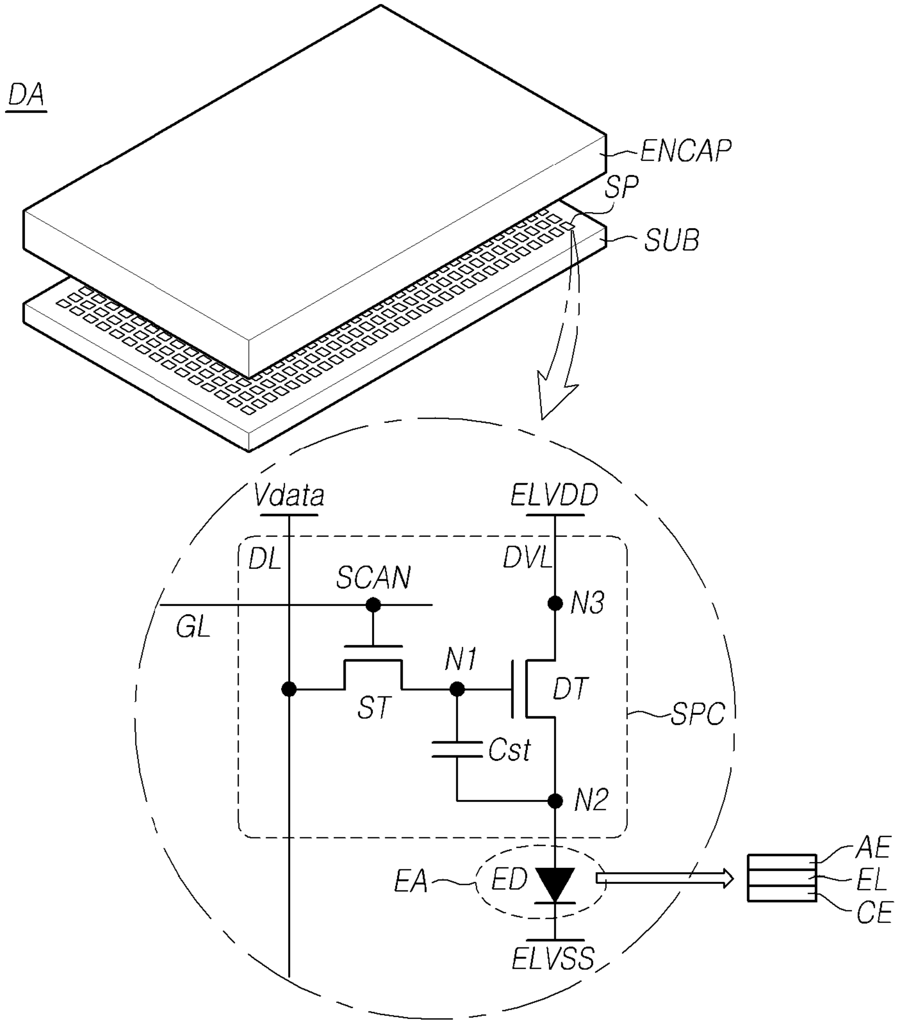
FIG. 3 illustrates an example display panel according to aspects of the present disclosure.

FIG. 3 illustrates an example configuration of the display panel 110 according to aspects of the present disclosure.

Referring to FIG. 3, a plurality of subpixels SP may be disposed in the display area DA of the display panel 110. The plurality of subpixels SP may be disposed in a normal area (e.g., the normal area of FIGS. 1A, 1B, and 1C), a first optical area (e.g., the first optical area OA1 of FIGS. 1A, 1B, and 1C), and a second optical area (e.g., the second optical area OA2 of FIGS. 1B and 1C) included in the display area DA of the display panel 110.

Referring to FIG. 3, each of the plurality of subpixels SP may include a light emitting element ED and a subpixel circuit SPC configured to drive the light emitting element ED.

Referring to FIG. 3, each subpixel circuit SPC may include a driving transistor DT for driving the light emitting element ED, a scan transistor ST for transmitting a data voltage Vdata to a first node N1 of the driving transistor DT, a storage capacitor Cst for maintaining a voltage at an approximate constant level during one frame, and the like.

The driving transistor DT may include the first node N1 to which a data voltage is applied, a second node N2 electrically connected to the light emitting element ED, and a third node N3 to which a driving voltage ELVDD through a driving voltage line DVL is applied. In the driving transistor DT, the first node N1 may be a gate node, the second node N2 may be a source node or a drain node, and the third node N3 may be the drain node or the source node. For convenience of description, descriptions that follow will be provided based on examples where the first, second and third nodes (N1, N2 and N3) of the driving transistor DT are gate, source and drain nodes, respectively, unless explicitly stated otherwise. However, it should be understood that the scope of the present disclosure includes examples where the first, second and third nodes (N1, N2 and N3) of the driving transistor DT are gate, drain and source nodes, respectively.

The light emitting element ED may include an anode electrode AE, an emission layer EL, and a cathode electrode CE. The anode electrode AE may represent a pixel electrode disposed in each subpixel SP, and may be electrically connected to the second node N2 of the driving transistor DT of each subpixel SP. The cathode electrode CE may represent a common electrode disposed for providing a common function in the plurality of subpixels SP, and a base voltage ELVSS such as a low-level voltage may be applied to the cathode electrode CE.

For example, the anode electrode AE may be a pixel electrode, and the cathode electrode CE may be a common electrode. In another example, the anode electrode AE may be a common electrode, and the cathode electrode CE may be a pixel electrode. For convenience of description, discussions that follow will be provided based on examples where the anode electrode AE is a pixel electrode, and the cathode electrode CE is a common electrode unless explicitly stated otherwise. However, it should be understood that the scope of the present disclosure includes examples where the anode electrode AE is a common electrode, and the cathode electrode CE is a pixel electrode.

The light emitting element ED may include a light emitting area EA having a predetermined size or area. The light emitting area EA of the light emitting element ED may be defined as, for example, an area with which all or two or more of an anode electrode AE, the emission layer EL, and the cathode electrode CE are overlapped.

The light emitting element ED may be, for example, an organic light emitting diode (OLED), an inorganic light emitting diode, a quantum dot light emitting element, or the like. In an embodiment where an organic light emitting diode (OLED) is used as the light emitting element ED, the emission layer EL thereof may include an organic emission layer including an organic material.

The scan transistor ST may be turned on and off by a scan signal SCAN that is a gate signal applied through a gate line GL, and be electrically connected between the first node N1 of the driving transistor DT and a data line DL.

The storage capacitor Cst may be electrically connected between the first node N1 and the second node N2 of the driving transistor DT.

The subpixel circuit SPC may be configured with two transistors (2T: DRT and SCT) and one capacitor (1C: Cst) (which may be referred to as a "2T1C structure") as shown in FIG. 3, and in some implementations, may further include one or more transistors, and/or further include one or more capacitors.

In one or more embodiments, the storage capacitor Cst, which may be present between the first node N1 and the second node N2 of the driving transistor DT, may be an external capacitor intentionally configured or designed to be located outside of the driving transistor DT, other than internal capacitors, such as parasitic capacitors (e.g., a gate-to-source capacitor Cgs, a gate-to-drain capacitor Cgd, and the like). Each of the driving transistor DT and the scan transistor ST may be an n-type transistor or a p-type transistor.

Since circuit elements (e.g., in particular, a light emitting element ED, which is implemented with an organic light emitting diode including an organic material) included in each subpixel SP are vulnerable to external moisture or oxygen, an encapsulation layer ENCAP may be disposed in the display panel 110 in order to prevent external moisture or oxygen from penetrating into such circuit elements. The encapsulation layer ENCAP may be disposed such that it covers the light emitting element ED.

Figure 4:
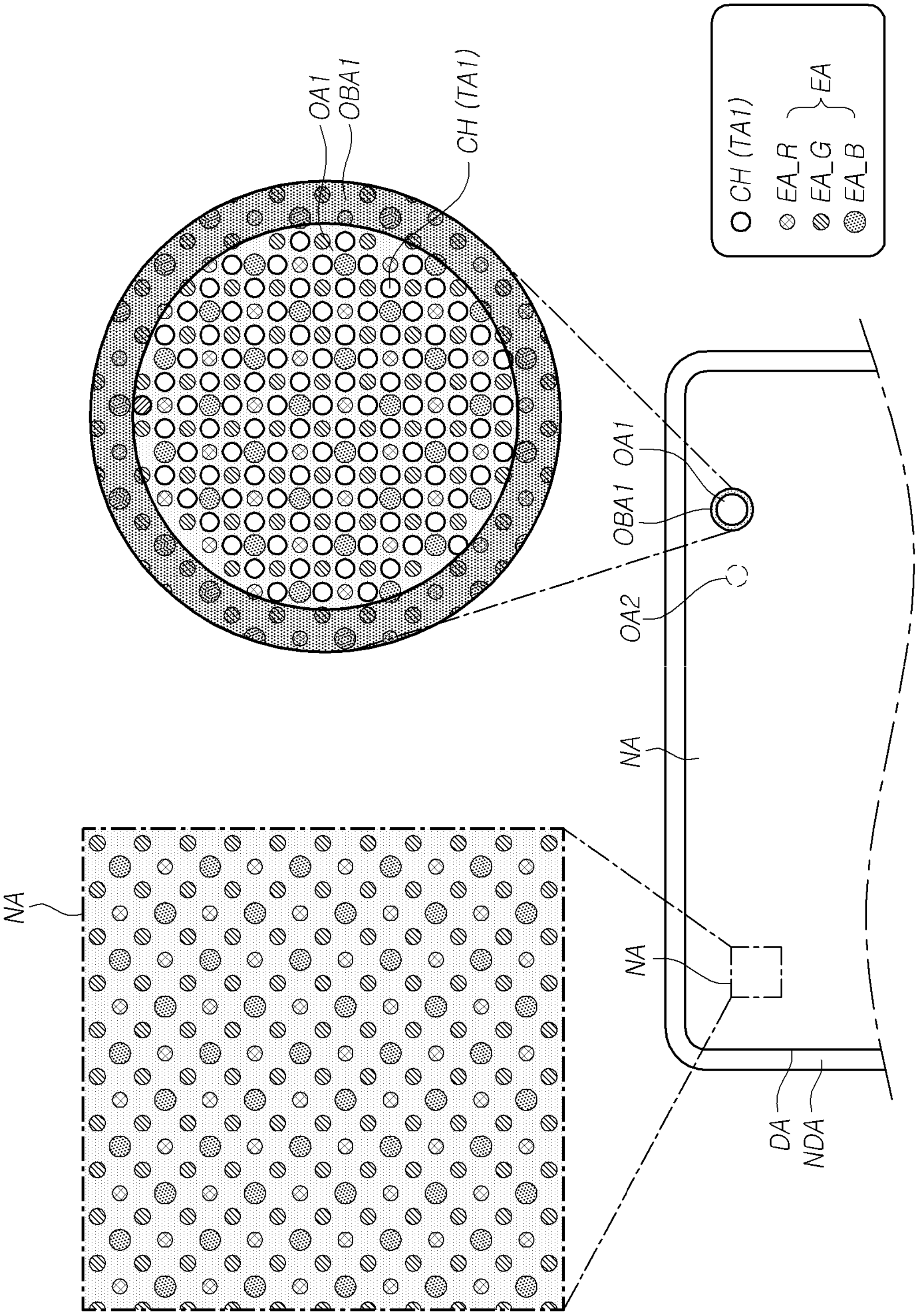
FIG. 4 illustrates an example normal area, an example first optical area, and an example first optical bezel area included in the display panel according to aspects of the present disclosure.

FIG. 4 illustrates example arrangements of a normal area (e.g., the normal area NA of figures described above), a first optical bezel area OBA1, and a first optical area (e.g., the first optical area OA1 of figures described above) included in the display panel 110 according to aspects of the present disclosure.

Referring to FIG. 4, the display panel 110 according to aspects of the present disclosure may include a display area (e.g., the display area DA of figures described above) where one or more images are displayed and a non-display area (e.g., the non-display area NDA of figures described above) where an image is not displayed.

Referring to FIG. 4, the display area DA may include the first optical area OA1, the first optical bezel area OBA1, and the normal area NA.

Referring to FIG. 4, the first optical area OA1 may represent an area overlapping the first optical electronic device 11, and may be, for example, a transmittable area through which light needed for the operation of the first optical electronic device 11 can pass. In this example, light transmitting the first optical area OA1 may include light of a single wavelength band or light of various wavelength bands. For example, the first optical area OA1 may be configured to allow, but not limited to, at least one of visible light, infrared light, ultraviolet light, and the like to transmit. In an embodiment when the first optical electronic device 11 is a camera, the first optical area OA1 may be at least configured to allow visible light to transmit for the operation of the camera. In another embodiment when the first optical electronic device 11 is an infrared sensor, the first optical area OA1 may be at least configured to allow infrared light to transmit for the operation of the infrared sensor.

Referring to FIG. 4, the first optical bezel area OBA1 may represent an area located outside of the first optical area OA1. The normal area NA may represent an area located outside of the first optical bezel area OBA1. The first optical bezel area OBA1 may be disposed between the first optical area OA1 and the normal area NA.

For example, the first optical bezel area OBA1 may be disposed outside of only a portion of an edge of the first optical area OA1, or disposed outside of the entire edge of the first optical area OA1. As illustrative shown in FIG. 4, in some implementations, the first optical bezel area OBA1 fully surrounds the first optical area OA1.

In the example where the first optical bezel area OBA1 is disposed outside of the entire edge of the first optical area OA1, the first optical bezel area OBA1 may have a ring shape surrounding the first optical area OA1.

For example, the first optical area OA1 may have various shapes such as a circular shape, an elliptical shape, a polygonal shape, an irregular shape, or the like. The first optical bezel area OBA1 may have various ring shapes (e.g., a circular ring shape, an elliptical ring shape, a polygonal ring shape, an irregular ring shape, or the like) surrounding the first optical area OA1 having various shapes.

Referring to FIG. 4, the display area DA may include a plurality of light emitting areas EA. As the first optical area OA1, the first optical bezel area OBA1, and the normal area NA are areas included in the display area DA, each of the first optical area OA1, the first optical bezel area OBA1, and the normal area NA may include a plurality of light emitting areas EA.

For example, the plurality of light emitting areas EA may include a first color light emitting area emitting light of a first color, a second color light emitting area emitting light of a second color, and a third color light emitting area emitting light of a third color.

At least one of the first color light emitting area, the second color light emitting area, and the third color light emitting area may have a different area or size from the remaining one or more light emitting areas of the first color light emitting area, the second color light emitting area, and the third color light emitting area.

The first color, the second color, and the third color may be different colors from one another, and may be various colors. For example, the first color, second color, and third color may be or include red, green, and blue, respectively.

Hereinafter, for convenience of description, the first color, the second color, and the third color is considered to be red, green, and blue, respectively. However, embodiments of the present disclosure are not limited thereto.

In the example where the first color, the second color, and the third color is red, green, and blue, respectively, an area of a blue light emitting area EA_B may be the largest among an area of a red light emitting area EA_R, an area of a green light emitting area EA_G, and the area of the blue light emitting area EA_B.

A light emitting element ED disposed in the red light emitting area EA_R may include an emission layer EL emitting red light. A light emitting element ED disposed in the green light emitting area EA_G may include an emission layer EL emitting green light. A light emitting element ED disposed in the blue light emitting area EA_B may include an emission layer EL emitting blue light.

Among the emission layer EL emitting red light, the emission layer EL emitting green light, and the emission layer EL emitting blue light, an organic material included in the emission layer EL emitting blue light may be most easily degraded in terms of material.

In one or more embodiments, as the blue light emitting area EA_B is configured or designed to have the largest area or size, current density supplied to the light emitting element ED disposed in the blue light emitting area EA_B may be the least. Therefore, a degradation degree of a light emitting element ED disposed in the blue light emitting area EA_B may be similar to a degradation degree of a light emitting element ED disposed in the red light emitting area EA_R and a degradation degree of a light emitting element ED disposed in the green light emitting area EA_G.

In consequence, a difference in degradation between the light emitting element ED disposed in the red light emitting area EA_R, the light emitting elements ED disposed in the green light emitting area EA_G, and the light emitting elements ED disposed in the blue light emitting area EA_B can be eliminated or reduced, and therefore, the display device 100 or the display panel 110 according to aspects of the present disclosure can provide an advantage of improving image quality. In addition, as a difference in degradation between the light emitting element ED disposed in the red light emitting area EA_R, the light emitting elements ED disposed in the green light emitting area EA_G, and the light emitting elements ED disposed in the blue light emitting area EA_B is eliminated or reduced, the display device 100 or the display panel 110 according to aspects of the present disclosure can therefore provide an advantage of reducing a difference in lifespan between the light emitting element ED disposed in the red light emitting area EA_R, the light emitting elements ED disposed in the green light emitting area EA_G, and the light emitting elements ED disposed in the blue light emitting area EA_B.

Referring to FIG. 4, the first optical area OA1 may be a transmittable area, and therefore, be desirable to have high transmittance. To achieve this requirement, in one or more embodiments, a cathode electrode CE disposed in the first optical area OA1, or a portion corresponding to the first optical area OA1 of a cathode electrode CE disposed across the first optical area OA1, the normal area NA and/or the first optical bezel area OBA1 may include a plurality of cathode holes CH. That is, in the first optical area OA1, the cathode electrode CE or the portion of the cathode electrode CE may include a plurality of cathode holes CH.

Referring to FIG. 4, in one or more embodiments, a cathode electrode CE disposed in the normal area NA, or a portion corresponding to the normal area NA of the cathode electrode CE disposed across the first optical area OA1, the normal area NA and/or the first optical bezel area OBA1 may not include a cathode hole CH. That is, in the normal area NA, the cathode electrode CE or the portion of the cathode electrode CE may not include a cathode hole CH.

In one or more embodiments, a cathode electrode CE disposed in the first optical bezel area OBA1, or a portion corresponding to the first optical bezel area OBA1 of the cathode electrode CE disposed across the first optical area OA1, the normal area NA and/or the first optical bezel area OBA1 may not include a cathode hole CH. That is, in the first optical bezel area OBA1, the cathode electrode CE or the portion of the cathode electrode CE may not include a cathode hole CH.

In the first optical area OA1, the plurality of cathode holes CH formed in the cathode electrode CE or the portion of the cathode electrode CE may also be referred to as a plurality of first transmission areas TA1 or a plurality of openings. Although FIG. 4 illustrates that a cathode hole CH has a circular shape, one or more cathode holes CH may have various shapes other than the circular shape, such as an elliptical shape, a polygonal shape, an irregular shape or the like.

Referring to FIG. 4, a second optical area (e.g., the second optical area OA2 in figures described above) may be disposed adjacent to the first optical area OA1. An arrangement of light emitting areas EA in the second optical area OA2 will be described in more detail with reference to FIG. 11.

Figure 5:
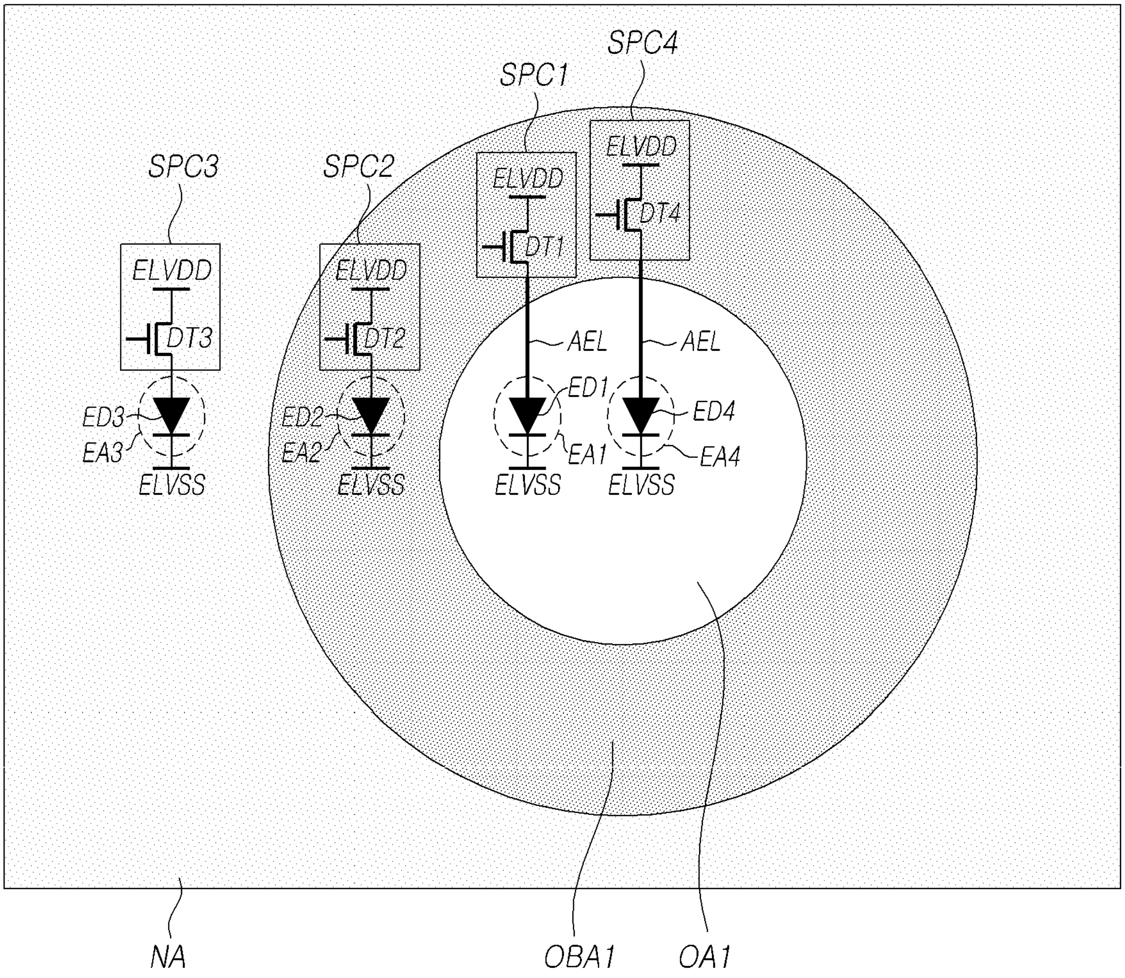
FIGS. 5 and 6 illustrate example light emitting elements disposed in each of the normal area, the first optical bezel area, and the first optical area, and example subpixel circuits configured to drive the light emitting elements in the display panel according to aspects of the present disclosure.

FIG. 5 illustrates an example configuration of the display panel 110 according to aspects of the present disclosure. As illustrated in FIG. 5, the display panel 110 may include light emitting elements (ED1, ED2, ED3, and ED4) disposed in the normal area NA, the first optical bezel area OBA1, and the first optical area OA1, and subpixel circuits (SPC1, SPC2, SPC3, and SPC4) for driving the light emitting elements (ED1, ED2, ED3, and ED4).

It should be understood here that each of the subpixel circuits (SPC1, SPC2, SPC3, and SPC4) may include transistors DT and ST, a storage capacitor Cst, and the like as shown in FIG. 3. However, it should be noted that for convenience of explanation, each of the subpixel circuits (SPC1, SPC2, SPC3, and SPC4) is briefly expressed as only a driving transistor (DT1, DT2, DT3, and DT4).

Referring to FIG. 5, the normal area NA, the first optical area OA1, and the first optical bezel area OBA1 may have structural differences as well as positional differences.

As one example of such structural differences, one or more subpixel circuits (SPC1, SPC2, SPC3, and/or SPC4) may be disposed in the first optical bezel area OBA1 and the normal area NA, but a subpixel circuit may not be disposed in the first optical area OA1. For example, the first optical bezel area OBA1 and the normal area NA may be configured to allow one or more transistors (DT1, DT2, DT3, and/or DT4) to be disposed therein and may include one or more transistors, and the first optical area OA1 may be configured not to allow a transistor to be present therein, and may not include a transistor therein.

Transistors and storage capacitors included in the subpixel circuits (SPC1, SPC2, SPC3, and SPC4) may be components causing transmittance to be lowered. Thus, since a subpixel circuit (e.g., SPC1, SPC2, SPC3, or SPC4) is not disposed in the first optical area OA1, transmittance of the first optical area OA1 can be more improved.

In one or more embodiments, although the subpixel circuits (SPC1, SPC2, SPC3, and SPC4) may be disposed only in the normal area NA and the first optical bezel area OBA1, the light emitting elements (ED1, ED2, ED3, and ED4) may be disposed in the normal area NA, the first optical bezel area OBA1, and the first optical area OA.

Referring to FIG. 5, although a first light emitting element ED1 may be disposed in the first optical area OA1, a first subpixel circuit SPC1 for driving the first light emitting element ED1 may not be located in the first optical area OA1.

Referring to FIG. 5, the first subpixel circuit SPC1 for driving the first light emitting element ED1 disposed in the first optical area OA1 may be disposed in the first optical bezel area OBA1, instead of being located in the first optical area OA1.

Hereinafter, the normal area NA, the first optical area OA1, and the first optical bezel area OBA1 will be described in more detail.

Referring to FIG. 5, in one or more embodiments, a plurality of light emitting areas EA included in the display panel 110 according to aspects of the present disclosure may include a first light emitting area EA1, a second light emitting area EA2, and a third light emitting area EA3. In these embodiments, the first light emitting area EA1, the second light emitting area EA2, and the third light emitting area EA3 may be included in the first optical area OA1, the first optical bezel area OBA1, and the normal area NA, respectively. Hereinafter, it is assumed that the first light emitting area EA1, the second light emitting area EA2, and the third light emitting area EA3 are areas emitting light of a same color.

Referring to FIG. 5, in one or more embodiments, the display panel 110 according to aspects of the present disclosure may include: a first light emitting element ED1 disposed in the first optical area OA1 and having the first light emitting area EA1; a second light emitting element ED2 disposed in the first optical bezel area OBA1 and having the second light emitting area EA2; and a third light emitting element ED3 disposed in the normal area NA and having the third light emitting area EA3.

Referring to FIG. 5, in one or more embodiments, the display panel 110 according to aspects of the present disclosure may further include a first subpixel circuit SPC1 configured to drive the first light emitting element ED1, a second subpixel circuit SPC2 configured to drive the second light emitting element ED2, and a third subpixel circuit SPC3 configured to drive the third light emitting element ED3.

Referring to FIG. 5, the first subpixel circuit SPC1 may include a first driving transistor DT1. The second subpixel circuit SPC2 may include a second driving transistor DT2. The third subpixel circuit SPC3 may include a third driving transistor DT3.

Referring to FIG. 5, in one or more embodiments, in the display panel 110 according to aspects of the present disclosure, the second subpixel circuit SPC2 may be located in the first optical bezel area OBA1 where the second light emitting element ED2 corresponding to the second subpixel circuit SPC2 is disposed, and the third subpixel circuit SPC3 may be located in the normal area NA where the third light emitting element ED3 corresponding to the third subpixel circuit SPC3 is disposed.

Referring to FIG. 5, in one or more embodiments, in the display panel 110 according to aspects of the present disclosure, the first subpixel circuit SPC1 may not be located in the first optical area OA1 where the first light emitting element ED1 corresponding to the first subpixel circuit SPC1 is disposed, and instead, may be located in the first optical bezel area OBA1 located outside of the first optical area OA1. As a result, the transmittance of the first optical area OA1 can be improved.

Referring to FIG. 5, in one or more embodiments, the display panel 110 according to aspects of the present disclosure may further include an anode extension line AEL electrically connecting the first light emitting element ED1 disposed in the first optical area OA1 to the first subpixel circuit SPC1 disposed in the first optical bezel area OBA1.

The anode extension line AEL may electrically extend or connect an anode electrode AE of the first light emitting element ED1 to a second node N2 of the first driving transistor DT1 in the first subpixel circuit SPC1.

As described above, in the display panel 110 according to aspects of the present disclosure, the first subpixel circuit SPC1 for driving the first light emitting element ED1 disposed in the first optical area OA1 may be disposed in the optical bezel area OBA1, while not being located in the first optical area OA1. Such a structure may be referred to as an anode extension structure.

In an embodiment where the display panel 110 according to aspects of the present disclosure has such an anode extension structure, all or a portion of the anode extension line AEL may be disposed in the first optical area OA1, and the anode extension line AEL may include a transparent material, or be or include a transparent line. Accordingly, even when the anode extension line AEL connecting the first subpixel circuit SPC1 and the first light emitting element ED1 is disposed in the first optical area OA1, the anode extension line AEL does not cause the transmittance of the first optical area OA1 to be lowered. The display device 100 or the display panel 110 according to aspects of the present disclosure can prevent the transmittance of the first optical area OA1 from being lowered.

Referring to FIG. 5, a plurality of light emitting areas EA may further include a fourth light emitting area EA4 emitting light of the same color as the first light emitting area EA1 and included in the first optical area OA1

Referring to FIG. 5, the fourth light emitting area EA4 may be disposed adjacent to the first light emitting area EA1 in a row direction or a column direction.

Referring to FIG. 5, in one or more embodiments, the display panel 110 according to aspects of the present disclosure may further include a fourth light emitting element ED4 disposed in the first optical area OA1 and having the fourth light emitting area EA4, and a fourth subpixel circuit SPC4 configured to drive the fourth light emitting element ED4.

Referring to FIG. 5, the fourth subpixel circuit SPC4 may include a fourth driving transistor DT4. For convenience of description, a scan transistor ST and a storage capacitor Cst included in the fourth subpixel circuit SPC4 are omitted from FIG. 5.

Referring to FIG. 5, although the fourth subpixel circuit SPC4 is a circuit for driving the fourth light emitting element ED4 disposed in the first optical area OA1, the fourth subpixel circuit SPC4 may be disposed in the first optical bezel area OBA1.

Referring to FIG. 5, in one or more embodiments, the display panel 110 according to aspects of the present disclosure may further include an anode extension line AEL electrically connecting the fourth light emitting element ED4 to the fourth subpixel circuit SPC4.

All or a portion of the anode extension line AEL may be disposed in the first optical area OA1, and the anode extension line AEL may include a transparent material, or be or include a transparent line.

As described above, the first subpixel circuit SPC1 disposed in the first optical bezel area OBA1 may be configured to drive one light emitting element ED1 disposed in the first optical area OA1. Such a circuit connection scheme may be referred to as a one-to-one (1:1) circuit connection scheme.

As a result, the number of subpixel circuits SPC disposed in the first optical bezel area OBA1 may be increased significantly. Further, the structure of the first optical bezel area OBA1 may become complicated, and an aperture ratio (or a light emitting area) of the first optical bezel area OBA1 may be reduced.

In order to increase the aperture ratio (or the light emitting area) of the first optical bezel area OBA1 while having an anode extension structure, in one or more embodiments, the display device 100 according to aspects of the present disclosure may be configured in an 1:N (where N is 2 or more) circuit connection scheme.

According to the 1:N circuit connection scheme, the first subpixel circuit SPC1 disposed in the first optical bezel area OBA1 may be configured to drive two light emitting elements ED disposed in the first optical area OA1 simultaneously or together.

Figure 6:
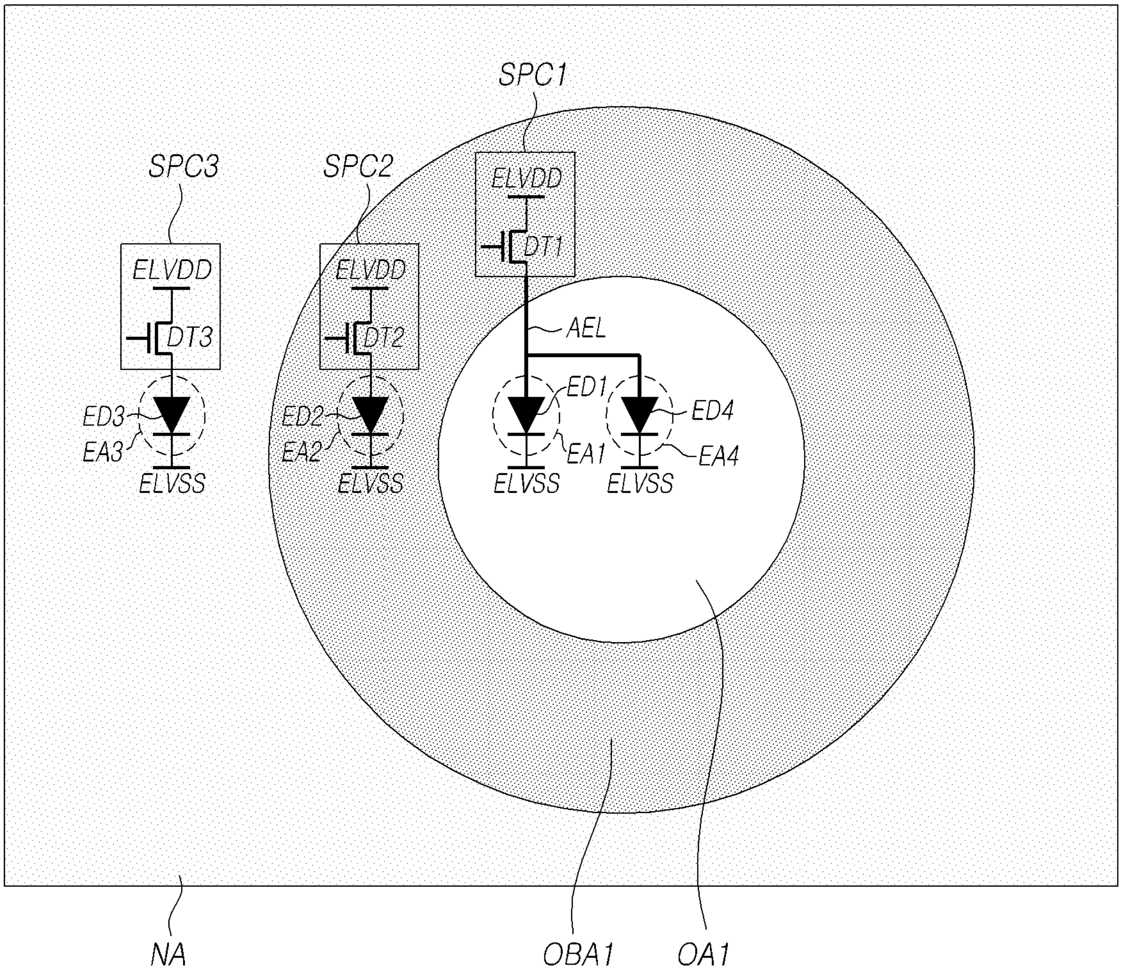

FIG. 6 illustrates an example based on an 1:2 circuit connection scheme for convenience of description. In this example, a first subpixel circuit SPC1 disposed in the first optical bezel area OBA1 is configured to drive two or more light emitting elements ED disposed in the first optical area OA1 simultaneously or together.

In the example of FIG. 6, the display panel 110 according to aspects of the present disclosure may include light emitting elements (ED1, ED2, ED3, and ED4) disposed in the normal area NA, the first optical bezel area OBA1, and the first optical area OA1, and subpixel circuits (SPC1, SPC2, and SPC3) for driving the light emitting elements (ED1, ED2, ED3, and ED4).

Referring to FIG. 6, a fourth light emitting element ED4 disposed in the first optical area OA1 may be driven by the first subpixel circuit SPC1 for driving a first light emitting element ED1 located in the first optical area OA1. That is, the first subpixel circuit SPC1 disposed in the first optical bezel area OBA1 may be configured to drive the first light emitting element ED1 and the fourth light emitting element ED4 disposed in the first optical area OA1 together or substantially simultaneously.

Accordingly, even when the display panel 110 has an anode extension structure, the number of subpixel circuits SPC disposed in the first optical bezel area OBA1 can be reduced, and thereby, an opening and a light emitting area of the first optical bezel area OBA1 can be increased.

In the example of FIG. 6, the first light emitting element ED1 and the fourth light emitting element ED4 driven together by the first subpixel circuit SPC1 disposed in the first optical bezel area OBA1 may be light emitting elements that emit light of a same color, and are adjacent to each other in a row direction or a column direction.

Referring to FIG. 6, an anode extension line AEL may connect the first light emitting element ED1 and the fourth light emitting element ED4 disposed in the first optical area OA1 to the first subpixel circuit SPC1 disposed in the first optical bezel area OBA1.

Figure 7:
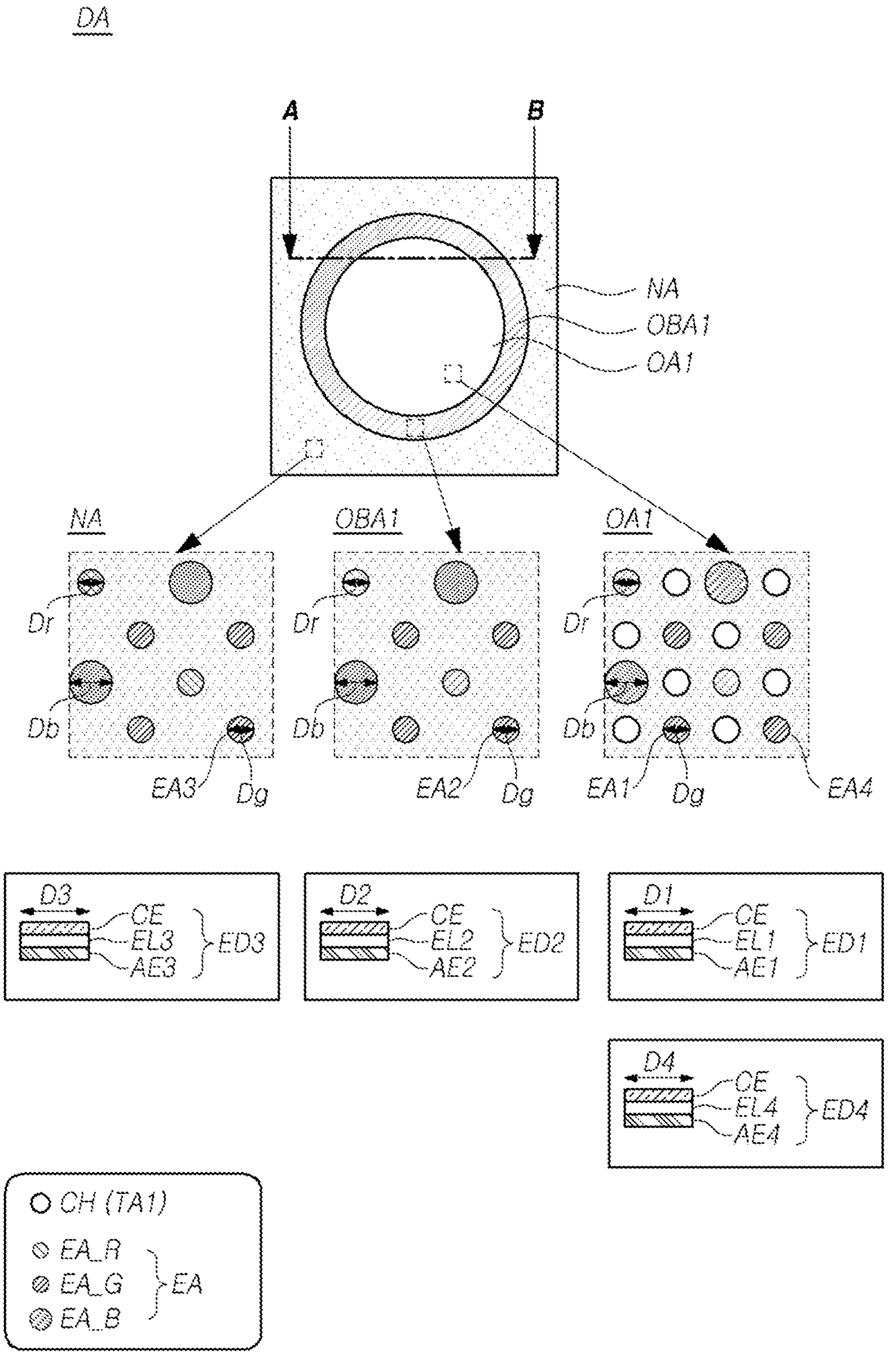
FIG. 7 illustrates example arrangements of light emitting areas in each of the normal area, the first optical area, and the first optical bezel area included in the display panel according to aspects of the present disclosure.
Figure 8:
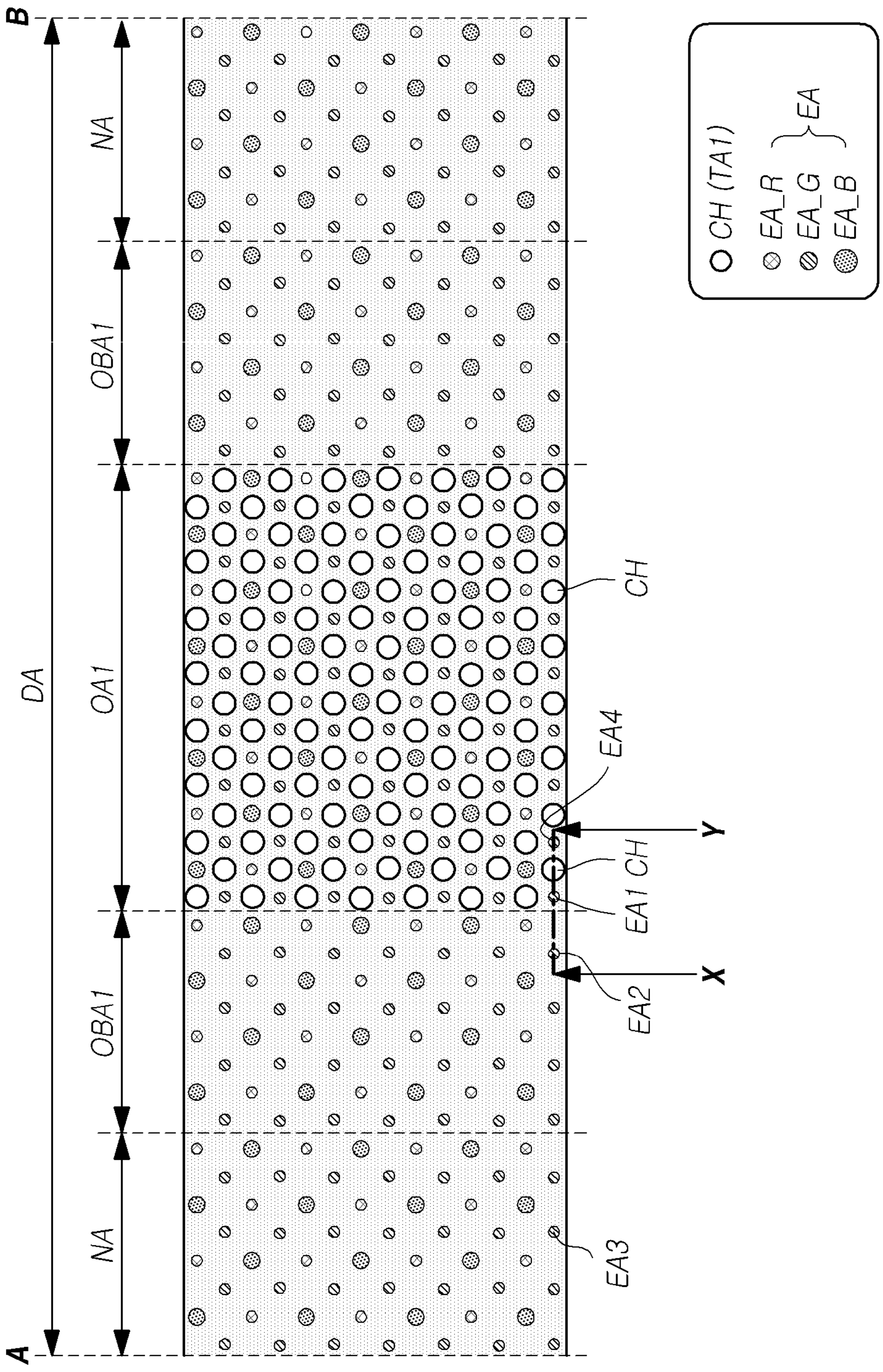
FIG. 8 is a plan view taken along line A-B of FIG. 7.

FIG. 7 illustrates an example arrangement of light emitting areas (EA1, EA2, EA3, and EA4) in the normal area NA, the first optical bezel area OBA1, and the first optical area OA1 of the display panel 110 according to aspects of the present disclosure. FIG. 8 is a plan view taken along line A-B of FIG. 7.

Referring to FIGS. 7 and 8, a plurality of light emitting areas EA may include a first light emitting area EA1 included in the first optical area OA1, a second light emitting area EA2 emitting light of the same color as the first light emitting area EA1 and included in the first optical bezel area OBA1, and a third light emitting area EA3 emitting light of the same color as the first light emitting area EA1 and included in the normal area NA.

Referring to FIGS. 7 and 8, the second light emitting area EA2 may have the same or substantially or nearly the same area as each of the first light emitting area EA1 and the third light emitting area EA3, or have a different area within a predetermined range from each of the first light emitting area EA1 and the third light emitting area EA3. The second light emitting area EA2 may have the same or substantially or nearly the same shape as each of the first light emitting area EA1 and the third light emitting area EA3.

Referring to FIGS. 7 and 8, the plurality of light emitting areas EA may further include a fourth light emitting area EA4 emitting light of the same color as the first light emitting area EA1 and included in the first optical area OA1.

Referring to FIGS. 7 and 8, the fourth light emitting area EA4 may have the same or substantially or nearly the same area as each of the first light emitting area EA1, the second light emitting area EA2, and the third light emitting area EA3, or have a different area within a predetermined range from each of the first light emitting area EA1, the second light emitting area EA2, and the third light emitting area EA3.

In an example where the first light emitting area EA1, the second light emitting area EA2, the third light emitting area EA3, and the fourth light emitting area EA4 are light emitting areas EA emitting light of a same color, a diameter of the first light emitting area EA1, a diameter of the second light emitting area EA2, a diameter of the third light emitting area EA3, and a diameter of the fourth light emitting area EA4 may be the same or substantially or nearly the same as one another.

Referring to FIGS. 7 and 8, an area of a red light emitting area EA_R in the first optical area OA1, an area of a red light emitting area EA_R in the first optical bezel area OBA1, and an area of a red light emitting area EA_R in the normal area NA may be the same or substantially or nearly the same as one another.

For example, a diameter Dr of the red light emitting area EA_R in the first optical area OA1, a diameter Dr of the red light emitting area EA_R in the first optical bezel area OBA1, and a diameter Dr of the red light emitting area EA_R in the normal area NA may be the same or substantially or nearly the same as one another.

An area of a green light emitting area EA_G in the first optical area OA1, an area of a green light emitting area EA_G in the first optical bezel area OBA1, and an area of a green light emitting area EA_G in the normal area NA may be the same or substantially or nearly the same as one another.

For example, a diameter Dg of the green light emitting area EA_G in the first optical area OA1, a diameter Dg of the green light emitting area EA_G in the first optical bezel area OBA1, and a diameter Dg of the green light emitting area EA_G in the normal area NA may be the same or substantially or nearly the same as one another.

An area of a blue light emitting area EA_B in the first optical area OA1, an area of a blue light emitting area EA_B in the first optical bezel area OBA1, and an area of a blue light emitting area EA_B in the normal area NA may be the same or substantially or nearly the same as one another.

For example, a diameter Db of the blue light emitting area EA_B in the first optical area OA1, a diameter Db of the blue light emitting area EA_B in the first optical bezel area OBA1, and a diameter Db of the blue light emitting area EA_B in the normal area NA may be the same or substantially or nearly the same as one another.

In one or more embodiments, in one or more of the first optical area OA1, the first optical bezel area OBA1, and the normal area NA, at least one of the diameter Dr of the red light emitting area EA_R, the diameter Dg of the green light emitting area EA_G, and the diameter Db of the blue light emitting area EA_B may be different from the remaining one or more diameters of the diameter Dr of the red light emitting area EA_R, the diameter Dg of the green light emitting area EA_G, and the diameter Db of the blue light emitting area EA_B. For example, in one or more of the first optical area OA1, the first optical bezel area OBA1, and the normal area NA, the diameter Db of the blue light emitting area EA_B may be greater than the diameter Dr of the red light emitting area EA_R and the diameter Dg of the green light emitting area EA_G.

Referring to FIGS. 7 and 8, an arrangement of light emitting areas EA in the first optical area OA1, an arrangement of light emitting areas EA in the first optical bezel area OBA1, and an arrangement of light emitting areas EA in the normal area NA may be the same or substantially or nearly the same as one another.

Referring to FIGS. 7 and 8, in one or more embodiments, the display panel 110 according to aspects of the present disclosure may further include a first anode electrode AE1 disposed in the first optical area OA1, a second anode electrode AE2 disposed in the first optical bezel area OBA1, a third anode electrode AE3 disposed in the normal area NA, and a fourth anode electrode AE4 disposed in the first optical area OA1.

In one or more embodiments, the display panel 110 according to aspects of the present disclosure may further include a cathode electrode CE commonly disposed in the normal area NA, the first optical bezel area OBA1, and the first optical area OA1. For example, the same cathode electrode CE is disposed to extend in each of the normal area NA, the first optical bezel area OBA1, and the first optical area OA1

In one or more embodiments, the display panel 110 according to aspects of the present disclosure may include a first emission layer EL1 disposed in the first optical area OA1, a second emission layer EL2 disposed in the first optical bezel area OBA1, a third emission layer EL3 disposed in the normal area NA, and a fourth emission layer EL4 disposed in the first optical area OA1.

The first emission layer EL1, second emission layer EL2, third emission layer EL3, and the fourth emission layer EL4 may be emission layers configured to emit light of a same color. In these embodiments, the first emission layer EL1, second emission layer EL2, third emission layer EL3, and the fourth emission layer EL4 may be separately disposed or may be integrated so that they can be implemented as one emission layer.

Referring to FIGS. 7 and 8, the display panel 110 according to aspects of the present disclosure may be configured such that: the first light emitting element ED1 may include the first anode electrode AE1, the first emission layer EL1, and the cathode electrode CE; the second light emitting element ED2 may include the second anode electrode AE2, the second emission layer EL2, and the cathode electrode CE; the third light emitting element ED3 may include the third anode electrode AE3, the third emission layer EL3, and the cathode electrode CE; and the fourth light emitting element ED4 may be configured with the fourth anode electrode AE4, the fourth emission layer EL4, and the cathode electrode CE.

Referring to FIGS. 7 and 8, the cathode electrode CE may include a plurality of cathode holes CH located in the first optical area OA1. For example, the plurality of cathode holes CH included in the cathode electrode CE may be present only in the first optical area OA1 among the first optical area OA1, the first optical bezel area OBA1, and the normal area NA.

As a result, the transmittance of the first optical area OA1 may become higher than the respective transmittance of the first optical bezel area OBA1 and the normal area NA.

The display panel 110 according to the above-described embodiments of the present disclosure may be briefly described as follows.

The display panel 110 according to aspects of the present disclosure may include a display area (e.g., the display area DA) where one or more images are displayed and a non-display area (e.g., the non-display area NDA) where an image is not displayed.

The display area DA may include a first optical area (e.g., the first optical area OA1), a first optical bezel area (e.g., the first optical bezel area OBA1) located outside of the first optical area OA1, and a normal area (e.g., the normal area NA) located outside of the first optical bezel area OBA1.

Each of the first optical area OA1, the first optical bezel area OBA1, and the normal area NA may include a plurality of light emitting areas EA.

The first optical area OA1 may be a transmittable area.

The first optical area OA1 may include a first light emitting element (e.g., the first light emitting element ED1) having a first light emitting area (e.g., the first light emitting area EA1).

The first optical bezel area OBA1 may include a second light emitting element (e.g., the second light emitting element ED2) having a second light emitting area EA2 (e.g., the second light emitting area EA2).

The first optical bezel area OBA1 may further include a first subpixel circuit (e.g., the first subpixel circuit SPC1) configured to drive the first light emitting element ED1 and a second subpixel circuit (e.g., the second subpixel circuit SPC2) configured to drive the second light emitting element ED2.

The display panel 110 according to aspects of the present disclosure may further include an anode extension line (e.g., the anode extension line AEL) electrically connecting the first light emitting element ED1 disposed in the first optical area OA1 to the first subpixel circuit SPC1 disposed in the first optical bezel area OBA1.

All or a portion of the anode extension line AEL may overlap the first optical area OA1, and include a transparent material, or be or include a transparent line.

The normal area NA may include a third light emitting element (e.g., the third light emitting element ED3) having a third light emitting area (e.g., the third light emitting area EA3) and a third subpixel circuit (e.g., the third subpixel circuit SPC3) configured to drive the third light emitting element ED3.

At least one of the first light emitting element ED1, the second light emitting element ED2, and the third light emitting element ED3 may emit light of a different color from the remaining one or more light emitting elements. In another example, the first light emitting element ED1, the second light emitting element ED2, and the third light emitting element ED3 may emit light of a same color.

In an example where the first light emitting element ED1, the second light emitting element ED2, and the third light emitting element ED3 emit light of a same color, the third light emitting area EA3 may have the same or substantially or nearly the same area as each of the first light emitting area EA1 and the second light emitting area EA2, or may have a different area within a predetermined range from each of the first light emitting area EA1 and the second light emitting area EA2.

Hereinafter, a cross-sectional structure taken along line X-Y of FIG. 8 will be discussed in more detail with reference to FIGS. 9 and 10.

A portion indicated by line X-Y in FIG. 8 includes a portion of the first optical bezel area OBA1 and a portion of the first optical area OA1 with respect to the boundary between the first optical bezel area OBA1 and the first optical area OA1.

The portion indicated by line X-Y in FIG. 8 may include the first light emitting area EA1 and the fourth light emitting area EA4 included in the first optical area OA1, and the second light emitting area EA2 included in the first optical bezel area OBA1. The first light emitting area EA1, the fourth light emitting area EA4, and the second light emitting area EA2 may represent light emitting areas EA emitting light of a same color.

Figure 9:
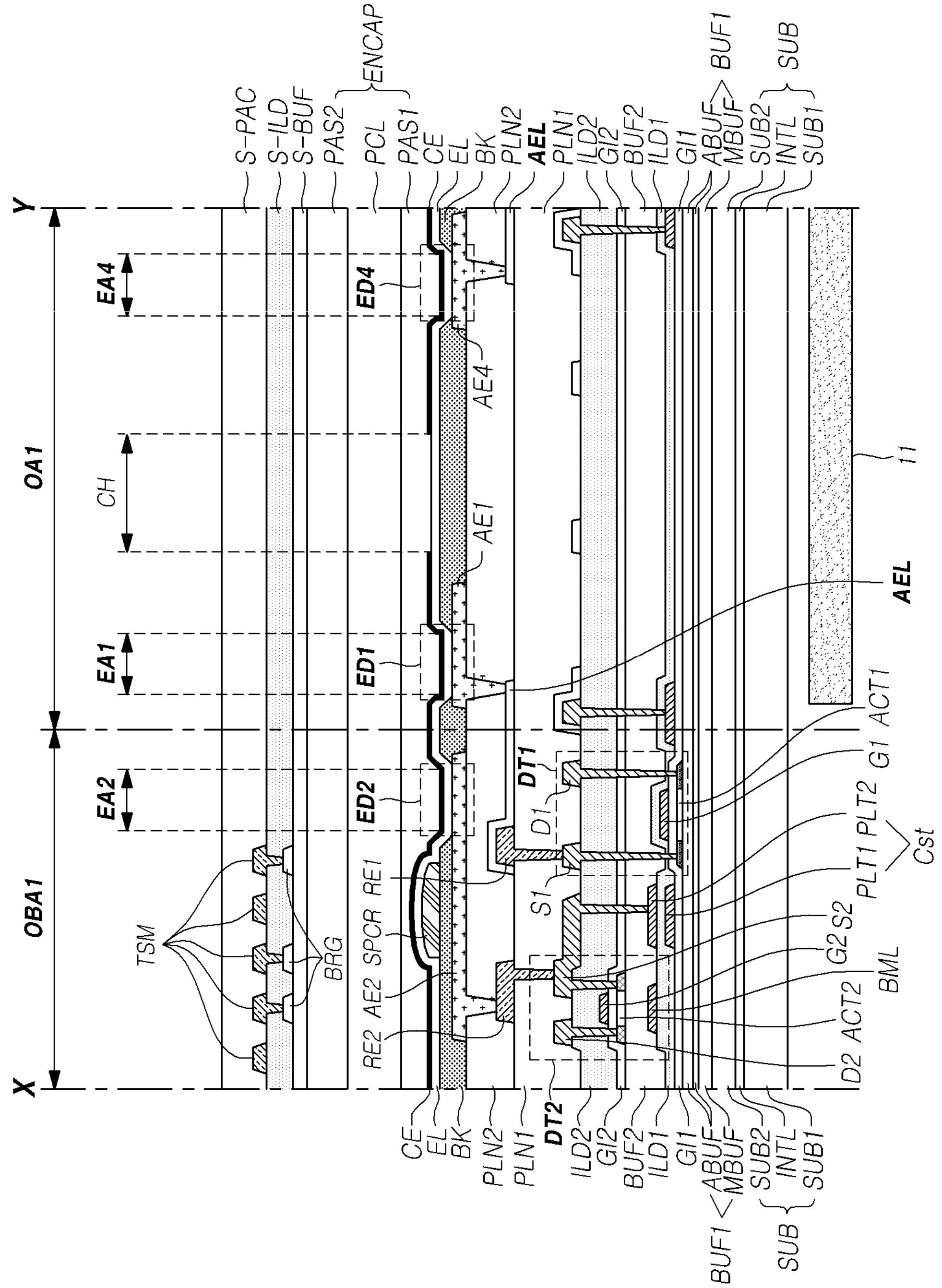
FIGS. 9 and 10 are example cross-sectional views of the display panel according to aspects of the present disclosure, and more specifically, cross-sectional views in the first optical bezel area and the first optical area of the display panel.

FIG. 9 illustrates an example cross-sectional view of the display panel 110 according to aspects of the present disclosure, and more specifically, illustrates example cross-sectional views in the first optical bezel area OBA1 and the first optical area OA1 of the display panel 110. It should be noted here that FIG. 9 illustrates cross-sectional views based on the application of an 1:1 circuit connection scheme, as in FIG. 5.

Referring to FIG. 9, from a vertical structure perspective, the display panel 110 may include a transistor forming part, a light emitting element forming part, and an encapsulation part.

The transistor forming part may include a substrate SUB, a first buffer layer BUF1 on the substrate SUB, various types of transistors DT1 and DT2 formed on the first buffer layer BUF, a storage capacitor Cst, and various electrodes and signal lines.

The substrate SUB may include, for example, a first substrate SUB1 and a second substrate SUB2, and may include an intermediate layer INTL interposed between the first substrate SUB1 and the second substrate SUB2. In this example, the intermediate layer INTL may be an inorganic film and may serve to block moisture permeation.

The first buffer layer BUF1 may include a stack of a single layer or a stack of multiple layers. In an example where the first buffer layer BUF1 includes a stack of multiple layers, the first buffer layer BUF1 may include a multi-buffer layer MBUF and an active buffer layer ABUF.

Various types of transistors (DT1, DT2, and the like), at least one storage capacitor Cst, and various electrodes or signal lines may be disposed on the first buffer layer BUF1.

For example, the transistors DT1 and DT2 formed on the first buffer layer BUF1 may include a same material, and be located in one or more same layers. In another example, as shown in FIG. 9, a first driving transistor DT1 and a second driving transistor DT2 among the transistors (DT1, DT2, and the like) may include different materials and be located in different layers Referring to FIG. 9, the first driving transistor DT1 may represent a driving transistor DT for driving the first light emitting element ED1 included in the first optical area OA1, and the second driving transistor DT2 may represent a driving transistor DT for driving the second light emitting element ED2 included in the first optical bezel area OBA1.

For example, the first driving transistor DT1 may represent a driving transistor included in the first subpixel circuit SPC1 for driving the first light emitting element ED1 included in the first optical area OA1, and the second driving transistor DT2 may represent a driving transistor included in the second subpixel circuit SPC2 for driving the second light emitting element ED2 included in the first optical bezel area OBA1.

Stackup configurations of the first driving transistor DT1 and the second driving transistor DT2 will be described below.

The first driving transistor DT1 may include a first active layer ACT1, a first gate electrode G1, a first source electrode S1, and a first drain electrode D1.

The second driving transistor DT2 may include a second active layer ACT2, a second gate electrode G2, a second source electrode S2, and a second drain electrode D2.

The second active layer ACT2 of the second driving transistor DT2 may be located in a higher location in the cross-sectional view than the first active layer ACT1 of the first driving transistor DT1.

The first buffer layer BUF1 may be disposed under the first active layer ACT1 of the first driving transistor DT1, and the second buffer layer BUF2 may be disposed under the second active layer ACT2 of the second driving transistor DT2.

For example, the first active layer ACT1 of the first driving transistor DT1 may be located on the first buffer layer BUF1, and the second active layer ACT2 of the second driving transistor DT2 may be located on the second buffer layer BUF2. In this example, the second buffer layer BUF2 may be located in a higher location in the cross-sectional view than the first buffer layer BUF.

The first active layer ACT1 of the first driving transistor DT1 may be disposed on the first buffer layer BUF1, and a first gate insulating layer GI1 may be disposed on the first active layer ACT1 of the first driving transistor DT1. The first gate electrode G1 of the first driving transistor DT1 may be disposed on the first gate insulating layer GI1, and a first interlayer insulating layer ILD1 may be disposed on the first gate electrode G1 of the first driving transistor DT1.

In this implementation, the first active layer ACT1 of the first driving transistor DT1 may include a first channel region overlapping the first gate electrode G1, a first source connection region located on one side of the first channel region, and a first drain connection region located on the other side of the first channel region.

A second buffer layer BUF2 may be disposed on the first interlayer insulating layer ILD1.

The second active layer ACT2 of the second driving transistor DT2 may be disposed on the second buffer layer BUF2, and a second gate insulating layer GI2 may be disposed on the second active layer ACT2. The second gate electrode G2 of the second driving transistor DT2 may be disposed on the second gate insulating layer GI2, and a second interlayer insulating layer ILD2 may be disposed on the second gate electrode G2.

In this implementation, the second active layer ACT2 of the second driving transistor DT2 may include a second channel region overlapping the second gate electrode G2, a second source connection region located on one side of the second channel region, and a second drain connection region located on the other side of the second channel region.

The first source electrode S1 and the first drain electrode D1 of the first driving transistor DT1 may be disposed on the second interlayer insulating layer ILD2. The second source electrode S2 and the second drain electrode D2 of the second driving transistor DT2 may be disposed on the second interlayer insulating layer ILD2.

The first source electrode S1 and the first drain electrode D1 of the first driving transistor DT1 may be respectively connected to the first source connection region and the first drain connection region of the first active layer ACT1 through through-holes formed in the second interlayer insulating layer ILD2, the second gate insulating layer GI2, the second buffer layer BUF2, the first interlayer insulating layer ILD1, and the first gate insulating layer GI1.

The second source electrode S2 and the second drain electrode D21 of the second driving transistor DT2 may be respectively connected to the second source connection region and the second drain connection region of the second active layer ACT2 through through-holes formed in the second interlayer insulating layer ILD2 and the second gate insulating layer GI2.

It should be understood that FIG. 9 illustrates only the second driving transistor DT2 and a storage capacitor Cst among circuit components included in the second subpixel circuit SPC2, and other components such as one or more transistors, and the like are omitted. It should be also understood that FIG. 9 illustrates only the first driving transistor DT1 among circuit components included in the first subpixel circuit SPC1, and other components such as one or more transistors, a storage capacitor, and the like are omitted.

Referring to FIG. 9, the storage capacitor Cst included in the second subpixel circuit SPC2 may include a first capacitor electrode PLT1 and a second capacitor electrode PLT2.

The first capacitor electrode PLT1 may be electrically connected to the second gate electrode G2 of the second driving transistor DT2, and the second capacitor electrode PLT2 may be electrically connected to the second source electrode S2 of the second driving transistor DT2.

In one or more embodiments, referring to FIG. 9, a lower metal BML may be disposed under the second active layer ACT2 of the second driving transistor DT2. This lower metal BML may entirely or partially overlap the second active layer ACT2.

The lower metal BML may be, for example, electrically connected to the second gate electrode G2. In another example, the lower metal BML may serve as a light shield to block light entering from a lower portion than the lower metal BML in the cross-sectional view. In this implementation, the lower metal BML may be electrically connected to the second source electrode S2.

Even though the first driving transistor DT1 is a transistor for driving the first light emitting element ED1 disposed in the first optical area OA1, the first driving transistor DT1 may be disposed in the first optical bezel area OBA1.

As the second driving transistor DT2 is a transistor for driving the second light emitting element ED2 disposed in the first optical bezel area OBA1, the second driving transistor DT2 may be disposed in the first optical bezel area OBA1.

Referring to FIG. 9, a first planarization layer PLN1 may be disposed on the first driving transistor DT1 and the second driving transistor DT2. For example, the first planarization layer PLN1 may be located on the first source electrode S1 and the first drain electrode D1 of the first driving transistor DT1 and the second source electrode S2 and the second drain electrode D2 of the second driving transistor DT2.

Referring to FIG. 9, a first relay electrode RE1 and a second relay electrode RE2 may be disposed on the first planarization layer PLN1.

The first relay electrode RE1 may represent an electrode for relaying an electrical connection between the first source electrode S1 of the first driving transistor DT1 and a first anode electrode AE1 of the first light emitting element ED1. The second relay electrode RE2 may represent an electrode for relaying an electrical connection between the second source electrode S2 of the second driving transistor DT2 and a second anode electrode AE2 of the second light emitting element ED2.

The first relay electrode RE1 may be electrically connected to the first source electrode S1 of the first driving transistor DT1 through a hole formed in the first planarization layer PLN1. The second relay electrode RE2 may be electrically connected to the second source electrode S2 of the second driving transistor DT2 through another hole formed in the first planarization layer PLN1.

Referring to FIG. 9, the first relay electrode RE2 and the second relay electrode RE2 may be disposed in the first optical bezel area OBA1.

In one or more embodiments, referring to FIG. 9, an anode extension line AEL may be connected to the first relay electrode RE1 and extend from the first optical bezel area OBA1 to the first optical area OA1.

In one or more embodiments, in FIG. 9, the anode extension line AEL may be a metal layer disposed on the first relay electrode RE1 and include a transparent material.

Referring to FIG. 9, a second planarization layer PLN2 may be disposed on the first relay electrode RE1, the second relay electrode RE2, and the anode extension line AEL such that it covers them.

Referring to FIG. 9, the light emitting element forming part may be located on the second planarization layer PNL2.

Referring to FIG. 9, the light emitting element forming part may include a first light emitting element ED1, a second light emitting element ED2, and a fourth light emitting element ED4, which are disposed on the second planarization layer PNL2.

Referring to FIG. 9, the first light emitting element ED1 and the fourth light emitting element ED4 may be disposed in the first optical area OA1, and the second light emitting element ED2 may be disposed in the first optical bezel area OBA1.

In the example of FIG. 9, the first light emitting element ED1, the second light emitting element ED2, and the fourth light emitting element ED4 may be light emitting elements emitting light of a same color. Emission layers EL of each of the first light emitting element ED1, the second light emitting element ED2, and the fourth light emitting element ED4 may be formed independently of one another. However, in discussions that follow, for convenience of explanation, it is assumed that respective emission layers EL of the first light emitting element ED1, the second light emitting element ED2, and the fourth light emitting element ED4 are formed together as one common emission layer.

Referring to FIG. 9, the first light emitting element ED1 may be configured (i.e., made up) in an area where the first anode electrode AE1, the emission layer EL, and the cathode electrode CE overlap. The second light emitting element ED2 may be configured (i.e., made up) in an area where the second anode electrode AE2, the emission layer EL, and the cathode electrode CE overlap. The fourth light emitting element ED4 may be configured (i.e., made up) in an area where the fourth anode electrode AE4, the emission layer EL, and the cathode electrode CE overlap.

Referring to FIG. 9, the first anode electrode AE1, the second anode electrode AE2, and the fourth anode electrode AE4 may be disposed on the second planarization layer PLN2.

The second anode electrode AE2 may be connected to the second relay electrode RE2 through a hole formed in the second planarization layer PLN2.

The first anode electrode AE1 may be connected to an anode extension line AEL extending from the first optical bezel area OBA1 to the first optical area OA1 through another hole formed in the second planarization layer PLN2. The interconnection portion in the hole may be part of the first anode electrode AE1 or may be a separate interconnection structure, e.g., a connection via, that is connected to the first anode electrode AE1, and that includes a same conductive material as the first anode electrode AE1. The anode extension line AEL may overlap with the first anode electrode AE1.

The fourth anode electrode AE4 may be connected to another anode extension line AEL extending from the first optical bezel area OBA1 to the first optical area OA1 through further another hole formed in the second planarization layer PLN2.

Referring to FIG. 9, a bank BK may be disposed on the first anode electrode AE1, the second anode electrode AE2, and the fourth anode electrode AE4.

The bank BK may include a plurality of bank holes, and respective portions of the first anode electrode AE1, the second anode electrode AE2, and the fourth anode electrode AE4 may be exposed through the plurality of bank holes. That is, the plurality of bank holes formed in the bank BK may overlap the respective portions of the first anode electrode AE1, the second anode electrode AE2, and the fourth anode electrode AE4.

Referring to FIG. 9, the emission layer EL may be disposed on the bank BK. The emission layer EL may contact the respective portions of the first anode electrode AE1, the second anode electrode AE2, and the fourth anode electrode AE4 through the plurality of bank holes.

Referring to FIG. 9, at least one spacer SPCR may be present between the emission layer EL and the bank BK.

Referring to FIG. 9, the cathode electrode CE may be disposed on the emission layer EL. The cathode electrode CE may include a plurality of cathode holes CH. The plurality of cathode holes CH formed in the cathode electrode CE may be disposed in the first optical area OA1.

One cathode hole CH illustrated in FIG. 9 may represent a cathode hole located between the first light emitting area EA1 and the fourth light emitting area EA4. In some implementations, the cathode holes CH each does not overlap or each offsets from the anode electrodes AE1, AE4. In such implementations, for example, the anode electrodes AE1, AE4 may be formed with transparent conductive materials or may be formed with opaque conductive materials.

Referring to FIG. 9, the encapsulation part may be located on the cathode electrode CE. The encapsulation part may include an encapsulation layer ENCAP disposed on the cathode electrode CE.

Referring to FIG. 9, the encapsulation layer ENCAP can serve to prevent penetration of moisture or oxygen into the light emitting elements (ED1, ED2, and ED4) disposed under the encapsulation layer ENCAP. In particular, the encapsulation layer ENCAP may include an organic material or film and can serve to prevent penetration of moisture or oxygen into the emission layer EL. In one or more embodiments, the encapsulation layer ENCAP may include a stack of a single layer or a stack of a multilayer.

Referring to FIG. 9, the encapsulation layer ENCAP may include a first encapsulation layer PAS1, a second encapsulation layer PCL, and a third encapsulation layer PAS2. First encapsulation layer PAS1 and the third encapsulation layer PAS2 may be, for example, inorganic material layers, and the second encapsulation layer PCL may be, for example, an organic material layer.

Since the second encapsulation layer PCL is implemented using an organic material, the second encapsulation layer PCL may serve as a planarization layer.

In one or more embodiments, a touch sensor may be embedded into the display panel 110 according to aspects of the present disclosure. In these embodiments, the display panel 110 according to aspects of the present disclosure may include a touch sensor part disposed on the encapsulation layer ENCAP.

Referring to FIG. 9, the touch sensor part may include touch sensor metals TSM and bridge metals BRG, and may further include one or more insulating layers such as a sensor buffer layer S-BUF, a sensor interlayer insulating layer S-ILD, a sensor protective layer S-PAC, and the like.

The sensor buffer layer S-BUF may be disposed on the encapsulation layer ENCAP. The bridge metals BRG may be disposed on the sensor buffer layer S-BUF, and the sensor interlayer insulating layer S-ILD may be disposed on the bridge metals BRG.

The touch sensor metals TSM may be disposed on the sensor interlayer insulating layer S-ILD. One or more of the touch sensor metals TSM may be connected to one or more corresponding bridge metals BRG of the bridge metals BRG through one or more holes formed in the sensor interlayer insulating layer S-ILD.

Referring to FIG. 9, the touch sensor metals TSM and the bridge metals BRG may be disposed in the first optical bezel area OBA1. The touch sensor metals TSM and the bridge metals BRG may be disposed not to overlap the second light emitting area EA2 of the first optical bezel area OBA1.

A plurality of touch sensor metals TSM may be configured as one touch electrode (or one touch electrode line), and/or may be arranged in a mesh pattern and electrically connected to one another. One or more of the touch sensor metals TSM and one or more of the remaining touch sensor metals TSM may be electrically connected through one or more bridge metals BRG, and thereby, be configured as one touch electrode (or one touch electrode line).

The sensor protective layer S-PAC may be disposed such that it covers the touch sensor metals TSM and the bridge metals BRG.

In an embodiment where a touch sensor is embedded into the display panel 110, at least one of the touch sensor metals TSM, or at least a portion of at least one of the touch sensor metals TSM, located on the encapsulation layer ENCAP may extend along an inclined surface formed in an edge of the encapsulation layer ENCAP, and be electrically connected to a pad located in an edge of the display panel 110 that is further away from the inclined surface of the edge of the encapsulation layer ENCAP. The pad may be disposed in the non-display area NDA and may be a metal pattern to which the touch driving circuit 260 is electrically connected.

Referring to FIG. 9, the first light emitting area EA1 included in the first optical area OA1, the second light emitting area EA2 included in the first optical bezel area OBA1, and the fourth light emitting area EA4 included in the first optical area OA1 may have the same or substantially or nearly the same area (light emitting area) as one another.

The display panel 110 according to the foregoing embodiments of the present disclosure may be briefly described as follows.

The display panel 110 according to aspects of the present disclosure may include a bank (e.g., the bank BK) disposed on a first anode electrode (e.g., the first anode electrode AE1) and having a bank hole exposing a portion of the first anode electrode AE1, and an emission layer (e.g., the emission layer EL) disposed on the bank BK and contacting the portion of the first anode electrode AE1 exposed through the bank hole.

The bank hole formed in the bank BK may not overlap a plurality of cathode holes CH. For example, the bank BK may not be depressed or perforated at a place where the cathode hole CH is present. Thus, at a place where the cathode hole CH is present, a second planarization layer (e.g., the second planarization layer PLN2) and a first planarization layer (e.g., the first planarization layer PLN1) located under the bank BK may not be depressed or perforated as well.

The display panel 110 according to aspects of the present disclosure may include a first driving transistor (e.g., the first driving transistor DT1) disposed in the first optical bezel area OBA1 to drive a first light emitting element (e.g., the first light emitting element ED1) disposed in the first optical area OA1, and a second driving transistor (e.g., the second driving transistor DT2) disposed in the first optical bezel area OBA1 to drive a second light emitting element (e.g., the second light emitting element ED2) disposed in the first optical bezel area OBA1.

The display panel 110 according to aspects of the present disclosure may further include the first planarization layer PLN1 disposed on the first driving transistor DT1 and the second driving transistor DT2, a first relay electrode (e.g., the first relay electrode RE1) disposed on the first planarization layer PLN1 and electrically connected to the first source electrode S1 of the first driving transistor DT1 through a hole formed in the first planarization layer PLN1, a second relay electrode (e.g., the second relay electrode RE2) disposed on the first planarization layer PLN1 and electrically connected to the second source electrode S2 of the second driving transistor DT2 through another hole formed in the first planarization layer PLN1, and the second planarization layer PLN2 disposed on the first relay electrode RE1 and the second relay electrode RE2.

The display panel 110 according to aspects of the present disclosure may further include an anode extension line (e.g., the anode extension line AEL) connecting between the first relay electrode RE1 and the first anode electrode AE1, and located on the first planarization layer PLN1.

A second anode electrode (e.g., the second anode electrode AE2) may be electrically connected to the second relay electrode RE2 through a hole formed in the second planarization layer PLN2, and the first anode electrode AE1 may be electrically connected to the anode extension line AEL through another hole formed in the second planarization layer PLN2.

All or a portion of the anode extension line AEL may be disposed in the first optical area OA1, and the anode extension line AEL may include a transparent material, or be or include a transparent line.

A first subpixel circuit (e.g., the first subpixel circuit SPC1) may include the first driving transistor DT1 for driving the first light emitting element ED1, and a second subpixel circuit (e.g., the second subpixel circuit SPC2) may include the second driving transistor DT2 for driving the second light emitting element ED2.

The first active layer ACT1 of the first driving transistor DT1 may be located in a different layer from the second active layer ACT2 of the second driving transistor DT2.

The display panel 110 according to aspects of the present disclosure may further include the substrate SUB, the first buffer layer BUF1 disposed between the substrate SUB and the first driving transistor DT1, and the second buffer layer BUF2 disposed between the first driving transistor DT1 and the second driving transistors DT2.

The first active layer ACT1 of the first driving transistor DT1 may include a different semiconductor material from the second active layer ACT2 of the second driving transistor DT2.

For example, the second active layer ACT2 of the second driving transistor DT2 may include an oxide semiconductor material. For example, such an oxide semiconductor material may include indium gallium zinc oxide (IGZO), indium gallium zinc tin oxide (IGZTO), zinc oxide (ZnO), cadmium oxide (CdO), indium oxide (InO), zinc tin oxide (ZTO), zinc indium tin oxide (ZITO), and the like.

For example, the first active layer ACT1 of the first driving transistor DT1 may include a different semiconductor material from the second active layer ACT2 of the second driving transistor DT2.

For example, the first active layer ACT1 of the first driving transistor DT1 may include a silicon-based semiconductor material. For example, the silicon-based semiconductor material may include low-temperature polycrystalline silicon (LTPS) or the like.

The display panel 110 according to aspects of the present disclosure may further include an encapsulation layer (e.g., the encapsulation layer ENCAP) located on the first light emitting element ED1, the second light emitting element ED2, and the third light emitting element ED3, and one or more touch sensor metals TSM located on the encapsulation layer ENCAP.

The touch sensor metal TSM may be disposed in the normal area NA and the first optical bezel area OBA1.

Referring to FIG. 9, the first optical area OA1 may overlap the first optical electronic device 11. The first optical bezel area OBA1 may not overlap the first optical electronic device 11. In one or more embodiments, a portion of the first optical bezel area OBA1 may overlap the first optical electronic device 11.

Referring to FIG. 9, a cross-sectional structure of the normal area NA may be substantially or nearly the same as that of the first optical bezel area OBA1. It should be noted here that the first subpixel circuit SPC1 disposed in the first optical bezel area OBA1 to drive the first light emitting element ED1 disposed in the first optical area OA1 may not be disposed in the normal area NA.

Figure 10:
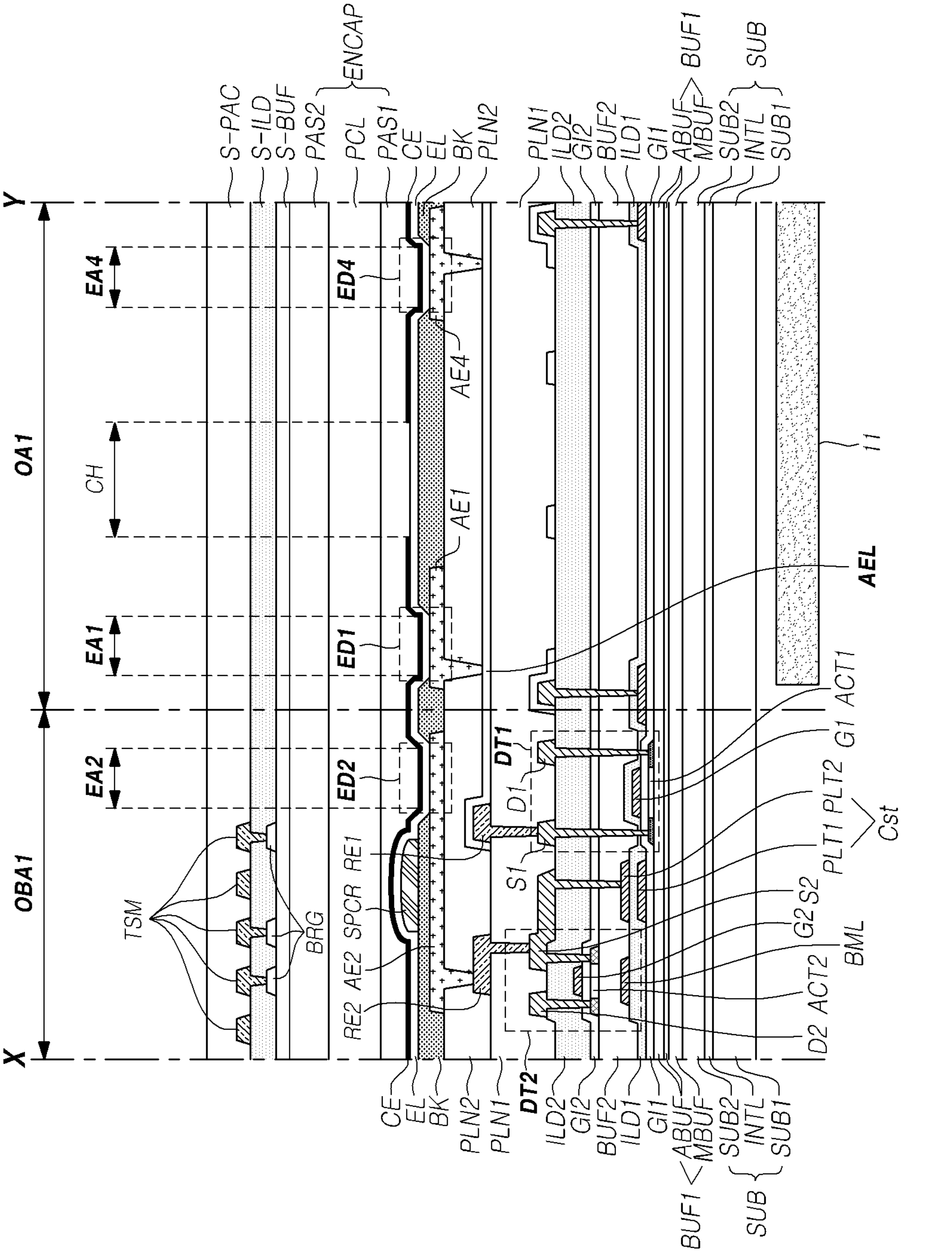

FIG. 10 illustrates an example cross-sectional view of the display panel 110 according to aspects of the present disclosure, and more specifically, illustrates example cross-sectional views in the first optical bezel area OBA1 and the first optical area OA1 of the display panel 110. It should be noted here that FIG. 10 illustrates the cross-sectional view based on the application of an 1:2 circuit connection scheme, as in FIG. 6.

The sectional view of FIG. 10 is basically the same as the sectional view of FIG. 9. However, it should be noted here that one difference between the cross-sectional views of FIGS. 9 and 10 is that while FIG. 9 employs the 1:1 circuit connection scheme as in FIG. 5, FIG. 10 employs the 1:2 circuit connection scheme as in FIG. 6. Taking account of the similarity between them, hereinafter, descriptions on the sectional structure of FIG. 10 will be provided by focusing on features different from the sectional structure of FIG. 9.

Referring to FIG. 10, a first light emitting element ED1 and a fourth light emitting element ED4 disposed in the first optical area OA1 may be driven by a first driving transistor DT1 disposed in the first optical bezel area OBA1 together or substantially simultaneously.

Accordingly, as illustrated in FIG. 10, an anode extension line AEL may be further electrically connected to a fourth anode electrode AE4, as well as a first anode electrode AE1. Thus, the anode extension line AEL may be electrically connected to both the first anode electrode AE1 of the first light emitting element ED1 and the fourth anode electrode AE4 of the fourth light emitting element ED4.

Referring to FIG. 10, the anode extension line AEL may overlap a cathode hole CH located between the first light emitting element ED1 and the fourth light emitting element ED4 among a plurality of cathode holes CH.

Referring to FIG. 10, the first light emitting area EA1 of the first light emitting element ED1 and the fourth light emitting area EA4 of the fourth light emitting element ED4 may be light emitting areas emitting light of a same color.

In the foregoing, discussions have been provided on various features by focusing on the first optical area OA1 overlapping the first optical electronic device 11. Hereinafter, discussions will be provided on various features by focusing on the second optical area OA2 overlapping the second optical electronic device 12.

Figure 11:
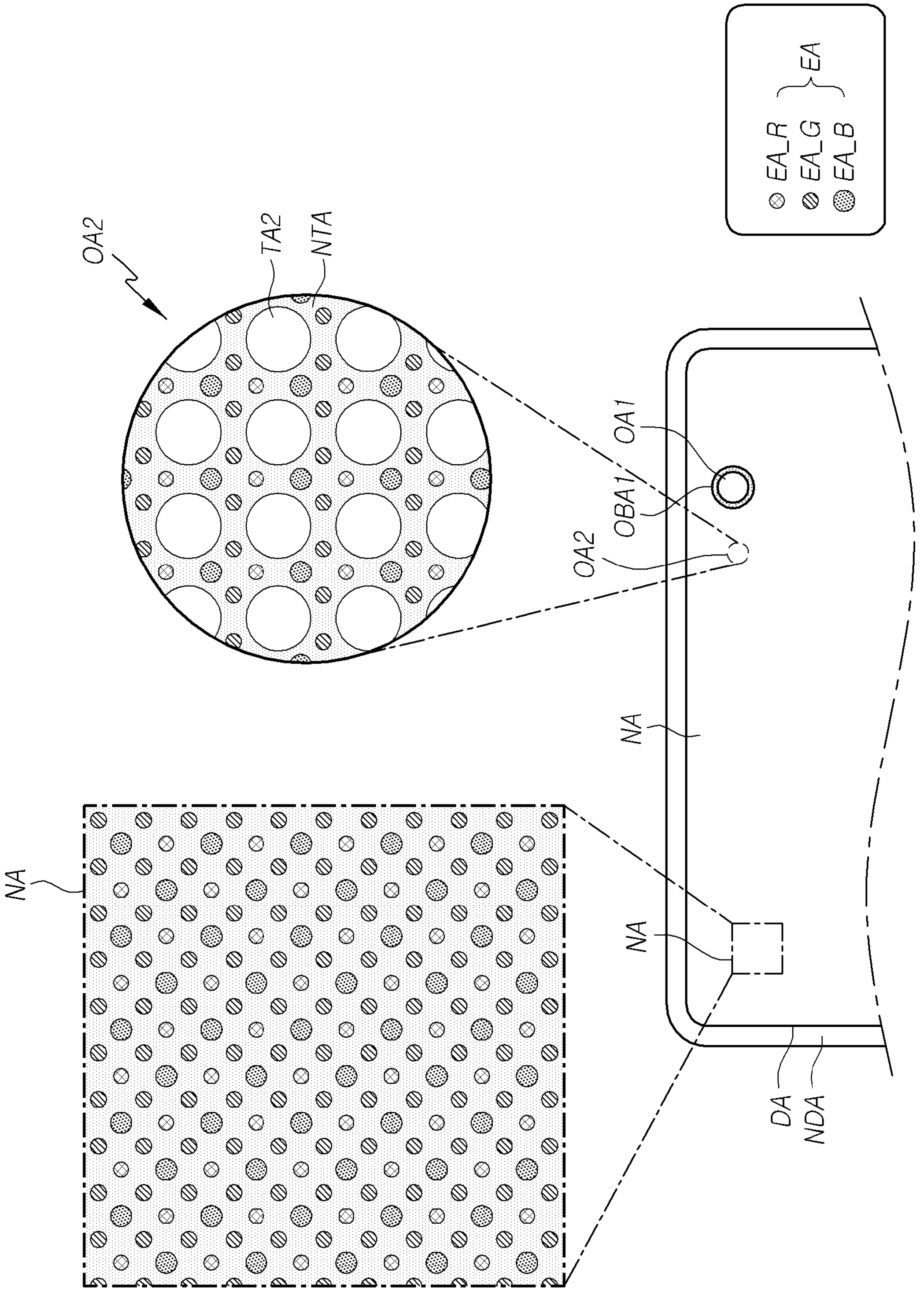
FIG. 11 illustrates the normal area and an example second optical area included in the display panel according to aspects of the present disclosure.

FIG. 11 illustrates the normal area NA and an example second optical area OA2 included in the display panel 110 according to aspects of the present disclosure.

Referring to FIG. 11, the display area DA may include the second optical area OA2. The second optical area OA2 may include a plurality of transmission areas TA2 and a plurality of light emitting areas EA.

Referring to FIG. 11, in the second optical area OA2, one or more areas except for the plurality of transmission areas TA2 may be a non-transmission area NTA.

Referring to FIG. 11, the non-transmission area NTA may include a plurality of light emitting areas EA. A plurality of light emitting elements ED for the plurality of light emitting areas EA may be disposed in the non-transmission area NTA.

Further, a plurality of subpixel circuits SPC for driving the plurality of light emitting elements ED may be disposed in the non-transmission area NTA. For example, a plurality of subpixel circuits SPC may be disposed in the second optical area OA2. This configuration is different from the configuration of the first optical area OA1 in which a plurality of subpixel circuits SPC are not disposed in the first optical area OA1.

Therefore, while a transistor (DT or ST) and a storage capacitor Cst may not be disposed in the first optical area OA1, transistors (DT and ST) and storage capacitors Cst may be disposed in the second optical area OA2.

Referring to FIG. 11, an arrangement of light emitting areas EA in the second optical area OA2 may be the same or substantially or nearly the same as an arrangement of light emitting areas EA in the normal area NA, and be also the same or substantially or nearly the same as an arrangement of light emitting areas EA in the first optical area OA1.

In one or more embodiments, referring to FIG. 11, an area of each of a plurality of light emitting areas EA included in the second optical area OA2 may be the same or substantially or nearly the same as, or be different within a predetermined range from, an area of each of a plurality of light emitting areas EA included in the normal area NA.

In one or more embodiments, the area of each of the plurality of light emitting areas EA included in the second optical area OA2 may be the same or substantially or nearly the same as, or be different within a predetermined range from, an area of each of a plurality of light emitting areas EA included in the first optical area OA1.

In an embodiment, all or at least a portion of the first optical area OA1 may overlap the first optical electronic device 11, and all or at least a portion of the second optical area OA2 may overlap the second optical electronic device 12.

The transmittance of the first optical area OA1 and the transmittance of the second optical area OA2 may be greater than that of the normal area NA.

The first optical electronic device 11 may be for example, a camera, and the second optical electronic device 12 may be, for example, a sensor different from the camera.

For example, the first optical electronic device 11 may be a device configured to receive visible light and perform a predetermined operation, and the second optical electronic device 12 may be a device configured to receive light (e.g., infrared light, and/or ultraviolet light) different from visible light and perform a predetermined operation.

For example, when the first optical electronic device 11 is a device that requires a greater amount of light than the second optical electronic device 12, the transmittance of the first optical area OA1 may be greater than or equal to the transmittance of the second optical area OA2.

Figure 12:
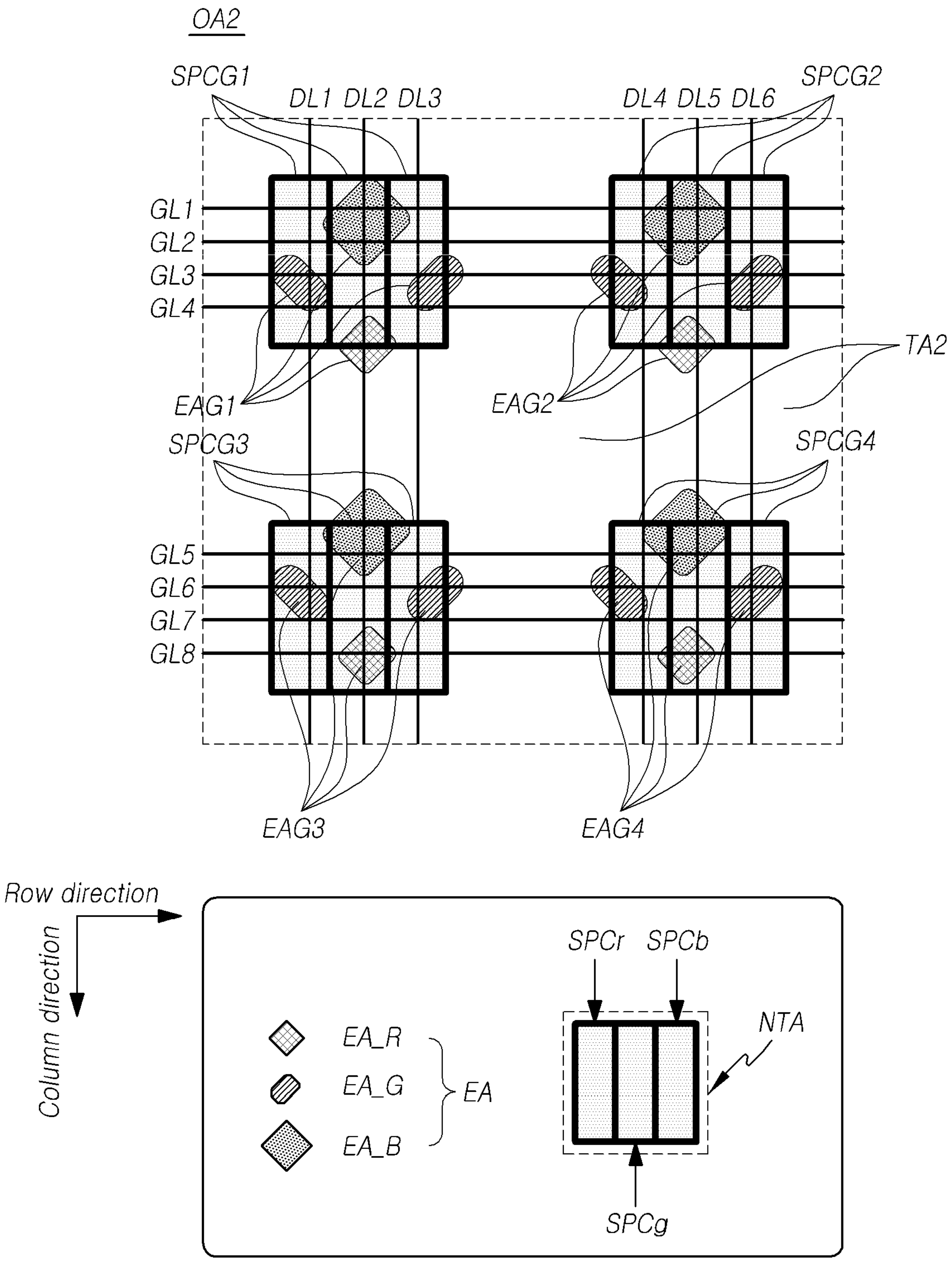
FIGS. 12 and 13 are example plan views of the second optical area in the display panel according to aspects of the present disclosure.
Figure 13:
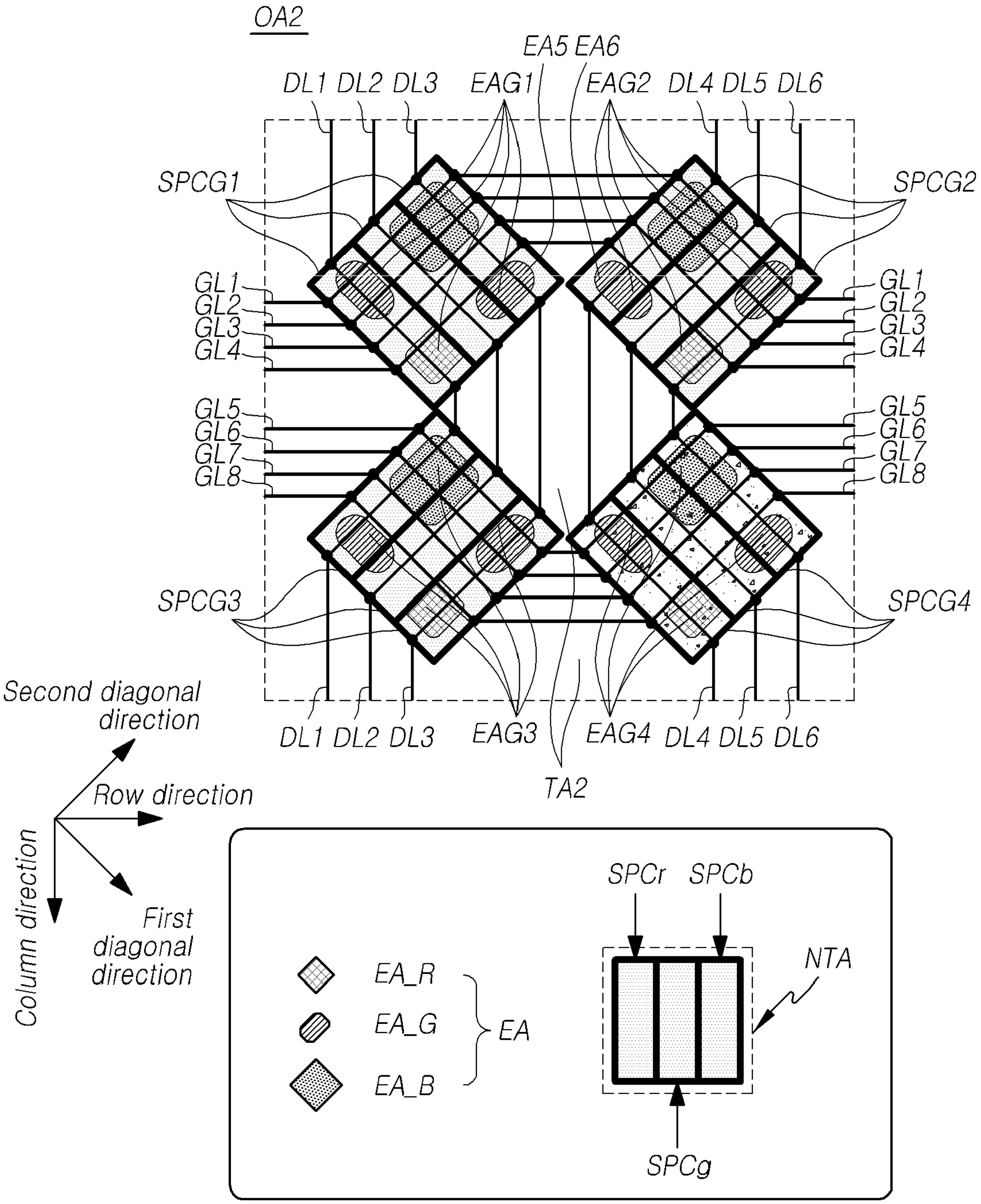

FIGS. 12 and 13 are example plan views of the second optical area OA2 in the display panel 110 according to aspects of the present disclosure.

Referring to FIGS. 12 and 13, the second optical area OA2 may include a non-transmission area NTA and one or more second transmission areas TA2 except for the non-transmission area NTA The non-transmission area NTA may include a plurality of light emitting areas EA.

A light emitting element ED may be disposed in each of the plurality of light emitting areas EA.

Light emitting elements ED and subpixel circuits (SPCr, SPCg, and/or SPCb) for driving the light emitting elements ED may be disposed in the non-transmission area NTA.

The light emitting elements ED and the subpixel circuits (SPCr, SPCg, and/or SPCb) may partially overlap each other. The subpixel circuits (SPCr, SPCg, and/or SPCb) may, for example, partially overlap the light emitting areas EA.

In one or more embodiments, the light emitting areas EA may include a first color light emitting area EA_R emitting light of a first color (e.g., red), a second color light emitting area EA_G emitting light of a second color (e.g., green), and a third color light emitting area EA_B emitting light of a third color (e.g., blue).

In the examples of FIGS. 12 and 13, one first color light emitting area EA_R, one third color light emitting area EA_B, and two second color light emitting areas EA_G may form one light emitting area group (EAG1, EAG2, EAG3, or EAG4).

FIGS. 12 and 13 illustrate four light emitting area groups (EAG1, EAG2, EAG3 and EAG4). The four light emitting area groups (EAG1, EAG2, EAG3 and EAG4) may include a first light emitting area group EAG1 at the upper left, a second light emitting area group EAG2 at the upper right, a third light emitting area group EAG3 at the lower left, and a fourth light emitting area group EAG4 at the lower right.

The four light emitting area groups (EAG1, EAG2, EAG3 and EAG4) may be driven by four subpixel circuit groups (SPCG1, SPCG2, SPCG3 and SPCG4). For example, the first light emitting area group EAG1, the second light emitting area group EAG2, the third light emitting area group EAG3, and the fourth light emitting area group EAG4 may be driven by a first subpixel circuit group SPCG1, a second subpixel circuit group SPCG2, a third subpixel circuit group SPCG3, and a fourth subpixel circuitry group SPCG4, respectively.

Each of the four subpixel circuit groups (SPCG1, SPCG2, SPCG3 and SPCG4) may include three subpixel circuits (SPCr, SPCg, and SPCb).

The three subpixel circuits (SPCr, SPCg, and SPCb) may include a first color subpixel circuit SPCr for driving one light emitting element ED corresponding to one first color light emitting area EA_R, a second color subpixel circuit SPCg for driving together two light emitting elements ED corresponding to two second color light emitting areas EA_G, and a third color subpixel circuit SPCb for driving one light emitting element ED corresponding to one third color light emitting area EA_B.

Referring to FIGS. 12 and 13, three data lines and four gate lines may be connected to each of the four subpixel circuit groups SPCG1 to SPCG4.

Referring to FIGS. 12 and 13, first, second, third, and fourth gate lines (GL1, GL2, GL3, and GL4) may be connected to the first subpixel circuit group SPCG1 and the second subpixel circuit group SPCG2, and fifth, sixth, seventh, and eighth gate lines (GL5, GL6, GL7, and GL8) may be connected to the third subpixel circuit group SPCG3 and the fourth subpixel circuit group SPCG4.

The first gate line GL1 may be connected to a third color subpixel circuit SPCb included in the first subpixel circuit group SPCG1, and be connected to a third color subpixel circuit SPCb included in the second subpixel circuit group SPCG2.

The third color subpixel circuit SPCb included in the first subpixel circuit group SPCG1 can drive a third color light emitting element ED corresponding to a third color light emitting area EA_B included in the first light emitting area group EAG1.

The third color subpixel circuit SPCb included in the second subpixel circuit group SPCG2 can drive a third color light emitting element ED corresponding to a third color light emitting area EA_B included in the second light emitting area group EAG2.

The second gate line GL2 may be connected to a second color subpixel circuit SPCg included in the first subpixel circuit group SPCG1, and be connected to a second color subpixel circuit SPCg included in the second subpixel circuit group SPCG2.

The second color subpixel circuit SPCg included in the first subpixel circuit group SPCG1 can drive a second color light emitting element ED corresponding to one of two second color light emitting areas EA_G included in the first light emitting area group EAG1.

The second color subpixel circuit SPCg included in the second subpixel circuit group SPCG2 can drive a second color light emitting element ED corresponding to one of two second color light emitting areas EA_G included in the second light emitting area group EAG2.

The third gate line GL3 may be connected to the second color subpixel circuit SPCg included in the first subpixel circuit group SPCG1, and be connected to the second color subpixel circuit SPCg included in the second subpixel circuit group SPCG2.

The second color subpixel circuit SPCg included in the first subpixel circuit group SPCG1 can drive a second color light emitting element ED corresponding to the other of the two second color light emitting areas EA_G included in the first light emitting area group EAG1.

The second color subpixel circuit SPCg included in the second subpixel circuit group SPCG2 can drive a second color light emitting element ED corresponding to the other of the two second color light emitting areas EA_G included in the second light emitting area group EAG2.

The fourth gate line GL4 may be connected to a first color subpixel circuit SPCr included in the first subpixel circuit group SPCG1, and be connected to a first color subpixel circuit SPCr included in the second subpixel circuit group SPCG2.

The first color subpixel circuit SPCr included in the first subpixel circuit group SPCG1 can drive a first color light emitting element ED corresponding to a first color light emitting area EA_R included in the first light emitting area group EAG1.

The first color subpixel circuit SPCr included in the second subpixel circuit group SPCG2 can drive a first color light emitting element ED corresponding to a first color light emitting area EA_R included in the second light emitting area group EAG2.

The fifth gate line GL5 may be connected to a third color subpixel circuit SPCb included in the third subpixel circuit group SPCG3, and be connected to a third color subpixel circuit SPCb included in the fourth subpixel circuit group SPCG4.

The third color subpixel circuit SPCb included in the third subpixel circuit group SPCG3 can drive a third color light emitting element ED corresponding to a third color light emitting area EA_B included in the third light emitting area group EAG3.

The third color subpixel circuit SPCb included in the fourth subpixel circuit group SPCG4 can drive a third color light emitting element ED corresponding to a third color light emitting area EA_B included in the fourth light emitting area group EAG4.

The sixth gate line GL6 may be connected to a second color subpixel circuit SPCg included in the third subpixel circuit group SPCG3, and be connected to a second color subpixel circuit SPCg included in the fourth subpixel circuit group SPCG4.

The second color subpixel circuit SPCg included in the third subpixel circuit group SPCG3 can drive a second color light emitting element ED corresponding to one of two second color light emitting areas EA_G included in the third light emitting area group EAG3.

The second color subpixel circuit SPCg included in the fourth subpixel circuit group SPCG4 can drive a second color light emitting element ED corresponding to one of two second color light emitting areas EA_G included in the fourth light emitting area group EAG4.

The seventh gate line GL7 may be connected to the second color subpixel circuit SPCg included in the third subpixel circuit group SPCG3, and be connected to the second color subpixel circuit SPCg included in the fourth subpixel circuit group SPCG4.

The second color subpixel circuit SPCg included in the third subpixel circuit group SPCG3 can drive a second color light emitting element ED corresponding to the other of the two second color light emitting areas EA_G included in the third light emitting area group EAG3.

The second color subpixel circuit SPCg included in the fourth subpixel circuit group SPCG4 can drive a second color light emitting element ED corresponding to the other of the two second color light emitting areas EA_G included in the fourth light emitting area group EAG4.

The eighth gate line GL8 may be connected to a first color subpixel circuit SPCr included in the third subpixel circuit group SPCG3, and be connected to a first color subpixel circuit SPCr included in the fourth subpixel circuit group SPCG4.

The first color subpixel circuit SPCr included in the third subpixel circuit group SPCG3 can drive a first color light emitting element ED corresponding to a first color light emitting area EA_R included in the third light emitting area group EAG3.

The first color subpixel circuit SPCr included in the fourth subpixel circuit group SPCG4 can drive a first color light emitting element ED corresponding to a first color light emitting area EA_R included in the fourth light emitting area group EAG4.

Referring to FIGS. 12 and 13, first, second, and third data lines (DL1, DL2, and DL3) may be connected to the first light emitting area group EAG1 and the third light emitting area group EAG3, and fourth, fifth, and sixth data lines (DL4, DL5, and DL6) may be connected to the second light emitting area group EAG2 and the fourth light emitting area Group EAG4.

The first data line DL1 may be connected to the first color subpixel circuit SPCr included in the first subpixel circuit group SPCG1, and be connected to the first color subpixel circuit SPCr included in the third subpixel circuit group SPCG3.

The second data line DL2 may be connected to the second color subpixel circuit SPCg included in the first subpixel circuit group SPCG1, and be connected to the second color subpixel circuit SPCg included in the third subpixel circuit group SPCG3.

The second color subpixel circuit SPCg included in the first subpixel circuit group SPCG1 can drive the emitting of one of the two second color light emitting areas EA_G included in the first light emitting area group EAG1 through the second data line DL2 at a first time, and drive the emitting of the other of the two second color light emitting areas EA_G included in the first light emitting area group EAG1 through the second data line DL2 at a second time.

The second color subpixel circuit SPCg included in the third subpixel circuit group SPCG3 can drive the emitting of one of the two second color light emitting areas EA_G included in the third light emitting area group EAG3 through the second data line DL2 at a third time, and drive the emitting of the other of the two second color light emitting areas EA_G included in the third light emitting area group EAG3 through the second data line DL2 at a fourth time.

The third data line DL3 may be connected to the third color subpixel circuit SPCb included in the first subpixel circuit group SPCG1, and be connected to the third color subpixel circuit SPCb included in the third subpixel circuit group SPCG3.

The fourth data line DL4 may be connected to the first color subpixel circuit SPCr included in the second subpixel circuit group SPCG2, and be connected to the first color subpixel circuit SPCr included in the fourth subpixel circuit group SPCG4.

The fifth data line DL5 may be connected to the second color subpixel circuit SPCg included in the second subpixel circuit group SPCG2, and be connected to the second color subpixel circuit SPCg included in the fourth subpixel circuit group SPCG4.

The second color subpixel circuit SPCg included in the second subpixel circuit group SPCG2 can drive the emitting of one of the two second color light emitting areas EA_G included in the second light emitting area group EAG2 through the fifth data line DL5 at a first time, and drive the emitting of the other of the two second color light emitting areas EA_G included in the second light emitting area group EAG2 through the fifth data line DL5 at a second time.

The second color subpixel circuit SPCg included in the fourth subpixel circuit group SPCG4 can drive the emitting of one of the two second color light emitting areas EA_G included in the fourth light emitting area group EAG4 through the fifth data line DL5 at a third time, and drive the emitting of the other of the two second color light emitting areas EA_G included in the fourth light emitting area group EAG4 through the fifth data line DL5 at a fourth time.

The sixth data line DL6 may be connected to the third color subpixel circuit SPCb included in the second subpixel circuit group SPCG2, and be connected to the third color subpixel circuit SPCb included in the fourth subpixel circuit group SPCG4.

Referring to FIGS. 12 and 13, each of the plurality of subpixel circuits (SPCr, SPCg, and SPCb) may overlap all or a portion of at least one light emitting area EA.

Referring to FIG. 12, in one or more embodiment, each of the plurality of subpixel circuits (SPCr, SPCg, and SPCb) may be disposed in a first direction, for example, the column direction.

The first to eighth gate lines GL1 to GL8 may be disposed in a second direction, for example, the row direction, and the first to sixth data lines DL1 to DL6 may be disposed in the first direction, for example, the column direction.

Referring to FIG. 13, in one or more embodiment, each of the plurality of subpixel circuits (SPCr, SPCg, and SPCb) may be disposed obliquely, for example, in a diagonal direction having a certain angle with respect to the first or second direction.

The three subpixel circuits (SPCr, SPCg, and SPCb) included in the first subpixel circuit group SPCG1 may be obliquely disposed in a first diagonal direction.

The three subpixel circuits (SPCr, SPCg, and SPCb) included in the second subpixel circuit group SPCG2 may be obliquely disposed in a second diagonal direction. The second diagonal direction may be a direction crossing the first diagonal direction. For example, the second diagonal direction may be perpendicular to the first diagonal direction.

The three subpixel circuits (SPCr, SPCg, and SPCb) included in the third subpixel circuit group SPCG3 may be obliquely disposed in the second diagonal direction.

The three subpixel circuits (SPCr, SPCg, and SPCb) included in the fourth subpixel circuit group SPCG4 may be obliquely disposed in the first diagonal direction.

Referring to FIG. 13, as the plurality of subpixel circuits (SPCr, SPCg, and SPCb) are obliquely disposed in such diagonal directions, each of the first to eighth gate lines GL1 to GL8 may have one or more bent portions.

In one or more embodiments, each of the first to fourth gate lines GL1 to GL4 may include a first portion disposed in the row direction, a second portion obliquely disposed in the second diagonal direction, a third portion disposed in the row direction, a fourth portion obliquely disposed in the first diagonal direction, and a fifth portion disposed in the row direction.

In one or more embodiments, each of the fifth to eighth gate lines GL5 to GL8 may include a first portion disposed in the row direction, a second portion obliquely disposed in the first diagonal direction, a third portion disposed in the row direction, a fourth portion obliquely disposed in the second diagonal direction, and a fifth portion disposed in the row direction.

Referring to FIG. 13, as the plurality of subpixel circuits (SPCr, SPCg, and SPCb) are obliquely disposed in such diagonal directions, each of the first to sixth data lines DL1 to DL6 may have one or more bent portions.

In one or more embodiments, each of the first to third data lines DL1 to DL3 may include a first portion disposed in the column direction, a second portion obliquely disposed in the first diagonal direction, a third portion disposed in the column direction, a fourth portion obliquely disposed in the second diagonal direction, and a fifth portion disposed in the column direction.

In one or more embodiments, each of the fourth to sixth data lines DL4 to DL6 may include a first portion disposed in the column direction, a second portion obliquely disposed in the second diagonal direction, a third portion disposed in the column direction, a fourth portion obliquely disposed in the first diagonal direction, and a fifth portion disposed in the column direction.

Hereinafter, descriptions will be provided on a cross-sectional structure of the second optical area OA2 by focusing on an example area between a fifth light emitting element ED5 and a sixth light emitting element ED6 shown in FIG. 13.

Figure 14:
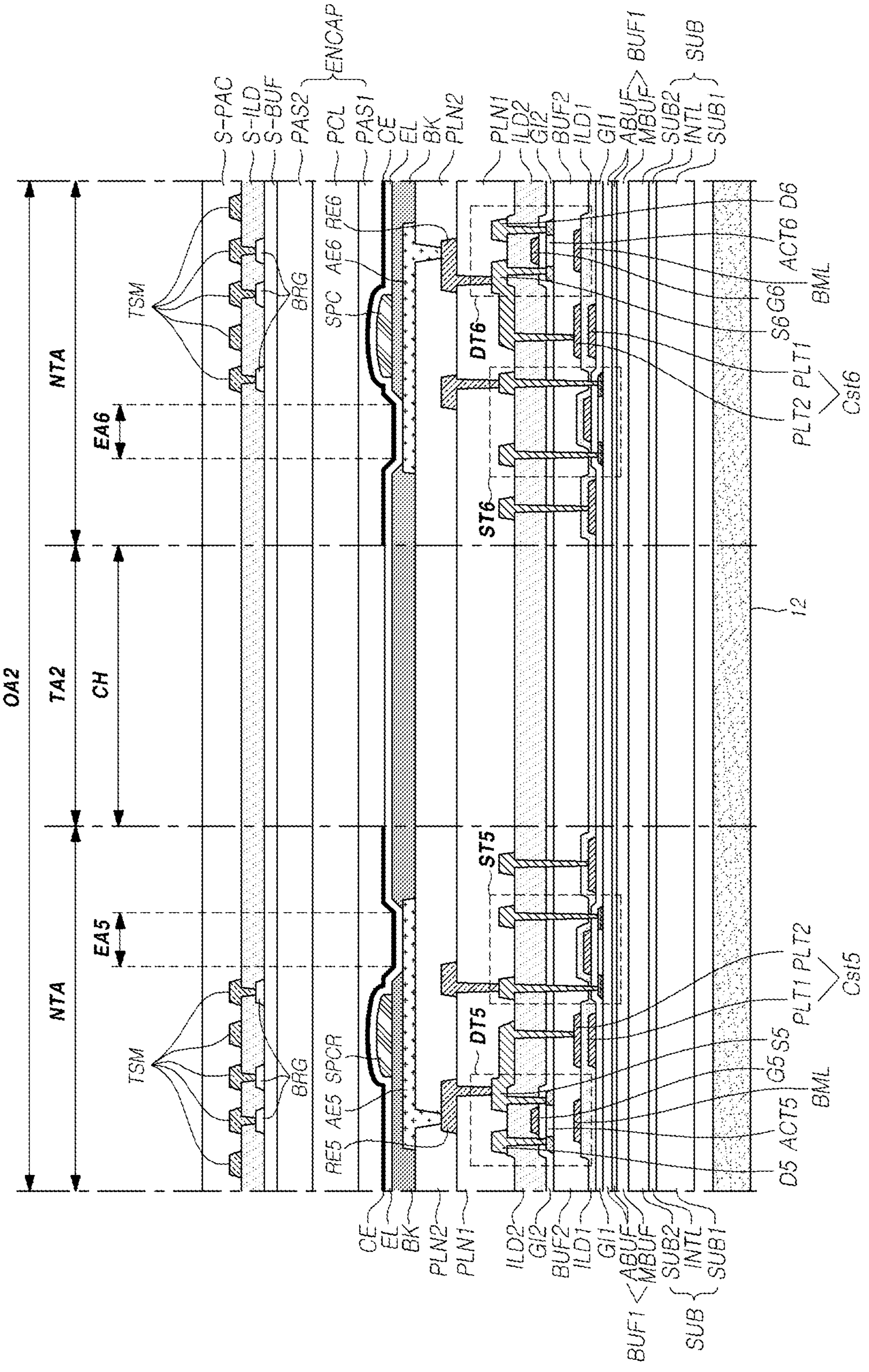
FIG. 14 illustrates an example cross-sectional view of the display panel according to aspects of the present disclosure, and more specifically, cross-sectional views of the second optical area of the display panel.

FIG. 14 illustrates an example cross-sectional view of the display panel 110 according to aspects of the present disclosure, and more specifically, illustrates example cross-sectional views in the second optical area OA2 of the display panel 110.

Metal layers and insulating layers in the cross-sectional structure of FIG. 14 may be the same, or substantially or nearly the same, as the metal layers and insulating layers in the cross-sectional structures of FIGS. 9 and 10. Taking account of the similarity between them, discussions on the cross-sectional structure of FIG. 14 will be provided by focusing on features different from those of the cross-sectional structures of FIGS. 9 and 10.

Referring to FIG. 14, the second optical electronic device 12 may be disposed such that it overlaps all or a portion of the second optical area OA2.

Referring to FIG. 14, a fifth light emitting element ED5 and a sixth light emitting element ED6 may be disposed in the second optical area OA2. A fifth light emitting area EA5 configured by the fifth light emitting element ED5 and a sixth light emitting area EA6 configured by the sixth light emitting element ED6 may be light emitting areas emitting light of a same color.

Referring to FIG. 14, an area where the fifth light emitting element ED5 and the sixth light emitting element ED6 are disposed may be a non-transmission area NTA, and a second transmission area TA2 may be present between the fifth light emitting element ED5 and the sixth light emitting element ED6. Thus, the second transmission area TA2 may be present between the fifth light emitting area EA5 configured by the fifth light emitting element ED5 and the sixth light emitting area EA6 configured by the sixth light emitting element ED6.

A subpixel circuit SPCg for driving the fifth light emitting element ED5 may be configured to drive the fifth light emitting element ED5, and be disposed such that it overlaps all or a portion of the fifth light emitting element ED5 in the second optical area OA2.

Referring to FIG. 14, the subpixel circuit SPCg for driving the fifth light emitting element ED5 may include a fifth driving transistor DT5, a fifth scan transistor ST5, and a fifth storage capacitor Cst5.

A subpixel circuit SPCg for driving the sixth light emitting element ED6 may be configured to drive the sixth light emitting element ED6, and be disposed such that it overlaps all or a portion of the sixth light emitting element ED6 in the second optical area OA2.

Referring to FIG. 14, the subpixel circuit SPCg for driving the sixth light emitting element ED6 may include a sixth driving transistor DT6, a sixth scan transistor ST6, and a sixth storage capacitor Cst6.

Referring to FIG. 14, the fifth driving transistor DT5 may include a fifth active layer ACT5, a fifth gate electrode G5, a fifth source electrode S5, and a fifth drain electrode D5.

The fifth light emitting element ED5 may be configured (i.e., made up) in an area where a fifth anode electrode AE5, an emission layer EL, and a cathode electrode CE overlap.

The fifth source electrode S5 of the fifth driving transistor DT5 may be connected to the fifth anode electrode AE5 through a fifth relay electrode RE5.

The fifth storage capacitor Cst5 may include a first capacitor electrode PLT1 and a second capacitor electrode PLT2.

The fifth source electrode S5 of the fifth driving transistor DT5 may be connected to the second capacitor electrode PLT2 of the fifth storage capacitor Cst5.

The fifth gate electrode G5 of the fifth driving transistor DT5 may be connected to the first capacitor electrode PLT1 of the fifth storage capacitor Cst5.

The active layer of the fifth scan transistor ST5 may be located on the first buffer layer BUF1 and be located in a lower location in the cross-sectional view than the fifth active layer ACT5 of the fifth driving transistor DT5.

Referring to FIG. 14, the sixth driving transistor DT6 may include a sixth active layer ACT6, a sixth gate electrode G6, a sixth source electrode S6, and a sixth drain electrode D6.

The sixth light emitting element ED6 may be configured (i.e., made up) in an area where a sixth anode electrode AE6, the emission layer EL, and the cathode electrode CE overlap.

The sixth source electrode S6 of the sixth driving transistor DT6 may be connected to the sixth anode electrode AE6 through a sixth relay electrode RE6.

The sixth storage capacitor Cst6 may include a first capacitor electrode PLT1 and a second capacitor electrode PLT2.

The sixth source electrode S6 of the sixth driving transistor DT6 may be connected to the second capacitor electrode PLT2 of the sixth storage capacitor Cst6.

The sixth gate electrode G6 of the sixth driving transistor DT6 may be connected to the first capacitor electrode PLT1 of the sixth storage capacitor Cst6.

The active layer of the sixth scan transistor ST6 may be located on the first buffer layer BUF1 and be located in a lower location in the cross-sectional view than the sixth active layer ACT6 of the sixth driving transistor DT6.

Referring to FIG. 14, a cathode electrode CE may not include a cathode hole CH or may include one or more cathode holes CH. The cathode holes CH formed in the cathode electrode CE may be located in the second transmission area TA2 of the second optical area OA2.

A bank hole formed in a bank BK may not overlap one or more cathode holes CH.

An upper surface of the bank BK located in a lower location than the cathode holes CH may be flat without being depressed or etched. For example, the bank BK may not be depressed or perforated at a place where a cathode hole CH is present. Thus, at a place where a cathode hole CH is present, the second planarization layer PLN2 and the first planarization layer PLN1 located in a lower location than the bank BK may not be depressed or perforated as well.

The flat upper surface of the bank BK located under the cathode holes CH may mean that one or more insulating layers or one or more metal patterns (e.g., one or more electrode, one or more lines, and/or the like), or one or more emission layers EL located under the cathode electrode CE formed through the process of forming one or more cathode holes CH in the cathode electrode CE have not been damaged.

A brief description for the process of forming one or more cathode holes CH in the cathode electrode CE is as follows. A specific mask pattern may be deposited at one or more locations where one or more cathode holes CH are to be formed, and then, a cathode electrode material may be deposited thereon. Accordingly, the cathode electrode material may be deposited only in an area where the specific mask pattern is not located, and thereby, the cathode electrode CE including one or more cathode holes CH can be formed.

The specific mask pattern may include, for example, an organic material. The cathode electrode material may include a magnesium-silver (Mg—Ag) alloy.

In one or more embodiments, after the cathode electrode CE having the one or more cathode holes CH is formed, the display panel 110 may be in a situation in which the specific mask pattern is completely removed, partially removed (where a portion of the specific mask pattern remains), or not removed (where the entirety of the specific mask pattern remains without being removed).

The embodiments described above will be briefly described as follows.

According to aspects of the present disclosure, a display device (e.g., the display device 100) can be provided that includes a display area allowing one or more images to be displayed therein and including a plurality of light emitting areas, and a non-display area in which an image is not displayed.

The display area may include a first optical area, a first optical bezel area located outside of the first optical area, and a normal area located outside of the first optical bezel area.

Each of the first optical area, the first optical bezel area, and the normal area may include two or more light emitting areas among the plurality of light emitting areas.

The first optical area may be a transmittable area.

The plurality of light emitting areas may include a first light emitting area included in the first optical area, a second light emitting area emitting light of the same color as the first light emitting area and included in the first optical bezel area, and a third light emitting area emitting light of the same color as the first light emitting area and included in the normal area.

The second light emitting area may have the same or substantially or nearly the same area as each of the first light emitting area and the third light emitting area, or may have a different area within a predetermined range from each of the first light emitting area and the third light emitting area.

An arrangement of light emitting areas in the first optical area, an arrangement of light emitting areas in the first optical bezel area, and an arrangement of light emitting areas in the normal area may be the same or substantially or nearly the same as one another.

For example, the two or more light emitting areas included in each of the first optical area, the first optical bezel area, and the normal area may include a first color light emitting area emitting light of a first color, a second color light emitting area emitting light of a second color, and a third color light emitting area emitting light of a third color.

In each of the first optical area, the first optical bezel area, and the normal area, at least one of the first color light emitting area, the second color light emitting area, and the third color light emitting area may have a different area from the remaining one or more light emitting areas.

The first optical bezel area may be disposed only outside of an edge (or a portion of the edge) of the first optical area, or be disposed outside of the entire edge of the first optical area such that the first optical bezel area has a ring shape surrounding the first optical area.

Each of the first optical bezel area and the normal area may be configured to allow one or more transistors to be disposed therein, and the first optical area may be configured not to allow a transistor to be disposed therein.

The display device according to aspects of the present disclosure may further include a first light emitting element disposed in the first optical area and having the first light emitting area, a second light emitting element disposed in the first optical bezel area and having the second light emitting area, and a third light emitting element disposed in the normal area and having the third light emitting area, a first subpixel circuit configured to drive the first light emitting element, a second subpixel circuit configured to drive the second light emitting element, and a third subpixel circuit configured to drive the third light emitting element.

The second subpixel circuit may be disposed in the first optical bezel area where the second light emitting element is disposed, and the third subpixel circuit may be disposed in the normal area where the third light emitting element is disposed.

The first subpixel circuit may not be disposed in the first optical area where the first light emitting element is disposed, and instead, may be disposed in the first optical bezel area located outside of the first optical area.

The plurality of light emitting areas may further include a fourth light emitting area emitting light of the same color as the first light emitting area and included in the first optical area OA1.

The fourth light emitting area may have the same or substantially or nearly the same area as each of the first light emitting area, the second light emitting area, and the third light emitting area, or may have a different area within a predetermined range from each of the first light emitting area, the second light emitting area, and the third light emitting area.

The fourth light emitting area may be disposed adjacent to the first light emitting area in a row direction or a column direction.

The display device according to aspects of the present disclosure may further include the fourth light emitting element disposed in the first optical area and having the fourth light emitting area.

The display device according to aspects of the present disclosure may further include a fourth subpixel circuit configured to drive the fourth light emitting element.

The first subpixel circuit included in the display device according to aspects of the present disclosure can be configured to drive together the first light emitting element and the fourth light emitting element disposed in the first optical area.

The display device according to aspects of the present disclosure may further include an anode extension line for electrically connecting the first light emitting element to the first subpixel circuit.

All or a portion of the anode extension line included in the display device according to aspects of the present disclosure may be disposed in the first optical area.

The anode extension line included in the display device according to aspects of the present disclosure may include a transparent material.

The display device according to aspects of the present disclosure may further includes a first anode electrode disposed in the first optical area, a second anode electrode disposed in the first optical bezel area, a third anode electrode disposed in the normal area, and a cathode electrode commonly disposed in the first optical area, the first optical bezel area, and the normal area as a common electrode.

The first light emitting element may be configured with the first anode electrode and the cathode electrode, the second light emitting element may be configured with the second anode electrode and the cathode electrode, and the third light emitting element may be configured with the third anode electrode and the cathode electrode.

A cathode electrode may include a plurality of cathode holes located in the first optical area.

The display device according to aspects of the present disclosure may include a bank disposed on the first anode electrode and including a bank hole exposing a portion of the first anode electrode, and an emission layer disposed on the bank and contacting the portion of the first anode electrode exposed through the bank hole.

The bank hole included in the display device according to aspects of the present disclosure may not overlap one or more cathode holes.

The display device according to aspects of the present disclosure may further include a first driving transistor disposed in the first optical bezel area to drive the first light emitting element disposed in the first optical area, and a second driving transistor disposed in the first optical bezel area to drive the second light emitting element disposed in the first optical bezel area, a first planarization layer disposed on the first driving transistor and the second driving transistor, a first relay electrode disposed on the first planarization layer and electrically connected to a first source electrode of the first driving transistor through a hole formed in the first planarization layer, a second relay electrode disposed on the first planarization layer and electrically connected to a second source electrode of the second driving transistor through another hole formed in the first planarization layer, a second planarization layer disposed on the first relay electrode and the second relay electrode, and an anode extension line connecting between the first relay electrode and the first anode electrode and located on the first planarization layer.

The second anode electrode included in the display device according to aspects of the present disclosure may be electrically connected to the second relay electrode through a hole formed in the second planarization layer, and the first anode electrode may be electrically connected to the anode extension line through another hole formed in the second planarization layer.

All or a portion of the anode extension line may be disposed in the first optical area, and may include a transparent material, or be or include a transparent line.

The anode extension line may overlap a cathode hole among a plurality of cathode holes, which is located between the first light emitting element and the fourth light emitting element different from the first light emitting element.

The first light emitting area of the first light emitting element and the fourth light emitting area of the fourth light emitting element may be light emitting areas emitting light of a same color.

The anode extension line may be further electrically connected to an anode electrode different from the first anode electrode.

The display device according to aspects of the present disclosure may include the first subpixel circuit including the first driving transistor for driving the first light emitting element, and the second subpixel circuit including the second driving transistor for driving the second light emitting element.

In the display device according to aspects of the present disclosure, a first active layer of the first driving transistor and a second active layer of the second driving transistor may be located in different layers.

The display device according to aspects of the present disclosure may further include a substrate, a first buffer layer disposed between the substrate and the first driving transistor, and a second buffer layer disposed between the first driving transistor and the second driving transistor.

The first active layer of the first driving transistor and the second active layer of the second driving transistor may include different semiconductor materials.

The display area of the display device according to aspects of the present disclosure may further include a second optical area.

The second optical area may include two or more transmission areas and two or more light emitting areas.

An area of each of a plurality of light emitting areas included in the second optical area may be the same or substantially or nearly the same as, or different within a predetermined range from, an area of the first light emitting area included in the first optical area.

The first optical area may be configured not to allow a transistor to be disposed therein, and the second optical area may be configured to allow one or more transistors to be disposed therein.

The display device according to aspects of the present disclosure may further include a fifth light emitting element disposed in the second optical area, and a fifth subpixel circuit configured to drive the fifth light emitting element and overlapping all or a portion of the fifth light emitting element in the second optical area.

The display device according to aspects of the present disclosure may further include a first optical electronic device overlapping the first optical area and a second optical electronic device overlapping the second optical area.

In the display device according to aspects of the present disclosure, the first optical electronic device may be a camera, and the second optical electronic device may be a sensor different from the camera.

The first optical area of the display device according to aspects of the present disclosure may configured to allow visible light, infrared light, or ultraviolet light to be transmitted.

The display device according to aspects of the present disclosure may further include an encapsulation layer on the first light emitting element, the second light emitting element, and the third light emitting element, and a touch sensor metal on the encapsulation layer The touch sensor metal included in the display device according to aspects of the present disclosure may be disposed in the normal area and the first optical bezel area.

According to aspects of the present disclosure, a display panel (e.g., the display panel 110) can be provided that includes a first optical area, a first optical bezel area located outside of the first optical area, and a normal area located outside of the first optical bezel area, and includes a display area in which one or more images are displayed, and a non-display area in which an image is not displayed.

Each of the first optical area, the first optical bezel area, and the normal area may include a plurality of light emitting areas.

The first optical area may include a plurality of transmission areas.

The first optical area may include a first light emitting element having a first light emitting area.

The first optical bezel area may include a second light emitting element having a second light emitting area.

The first optical bezel area may further include a first subpixel circuit configured to drive the first light emitting element and a second subpixel circuit configured to drive the second light emitting element.

The display panel may further include an anode extension line for electrically connecting the first light emitting element in the first optical area to the first subpixel circuit in the first optical bezel area.

All or a portion of the anode extension line may overlap the first optical area, and may include a transparent material, or be or include a transparent line.

The normal area may include a third light emitting element having a third light emitting area and a third subpixel circuit configured to drive the third light emitting element.

In an example where the first light emitting element, the second light emitting element, and the third light emitting element emit light of a same color, the third light emitting area may have the same or substantially or nearly the same area as each of the first light emitting area and the second light emitting area, or may have a different area within a predetermined range from each of the first light emitting area and the second light emitting area.

According to the embodiments described herein, a display panel (e.g., the display panel 110) and a display device (e.g., the display device 100) can be provided that include a light transmission structure for enabling one or more optical electronic devices to normally receive light (e.g., visible light, infrared light, ultraviolet light, or the like) while not being exposed in a front surface of the display device.

According to the embodiments described herein, a display panel (e.g., the display panel 110) and a display device (e.g., the display device 100) can be provided that are capable of reducing or eliminating image quality non-uniformity that may occur between an optical area and a normal area by designing respective light emitting areas of the transmittable optical area and the non-transmittable normal area to have different structures.

According to the embodiments described herein, a display panel (e.g., the display panel 110) and a display device (e.g., the display device 100) can be provided that, when a plurality of optical electronic devices are employed, include a plurality of optical areas corresponding to the plurality of optical electronic devices respectively, and more particularly, having respective distinct structures suitable for the plurality of optical electronic devices.

According to the embodiments described herein, the transmittance of the first and second optical areas OA1 and OA2 can be further improved through a cathode hole structure implemented in the first and second optical areas OA1 and OA2, and thereby, performance of the operation of the first and second optical electronic devices 11 and 12 (e.g., the image, video, or object capturing operation of a camera, the sensing operation of a sensor, and the like) can be improved.

According to the embodiments described herein, a display panel (e.g., the display panel 110) and a display device (e.g., the display device 100) can be provided that include a cathode electrode with a plurality of cathode holes located in an optical area, and thereby, increasingly improve the transmittance of the optical area while preventing an area or element adjacent to the cathode holes from being damaged or varied in the process of forming the cathode holes.

According to the embodiments described herein, as all areas (NA, OA1, OBA1, and OA2) of the display panel 110 are designed to have substantially the same subpixel structure, one or more different types of masks (e.g., a fine metal mask (FMM)) need not be used, and as a result, the manufacturing process of the display panel 110 can be simplified and the number of masks can be reduced.

Additional features and aspects will be set forth in part in the description which follows and in part will become apparent from the description or may be learned by practice of the inventive concepts provided herein. Other features and aspects of the inventive concepts may be realized and attained by the structure particularly pointed out in, or derivable from, the written description, the claims hereof, and the appended drawings.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the appended claims. Nothing in this section should be taken as a limitation on those claims.

It is to be understood that both the foregoing general description and the following detailed description of the present disclosure are illustrative examples and explanatory and are intended to provide further explanation of the inventive concepts as claimed.

Described embodiments of the subject matter can include one or more features, alone or in combination. For example, in a first implementation, a display device includes: a display area configured to display an image and comprising a plurality of light emitting areas; and a non-display area configured not to display an image. The display area comprises a first optical area, a first optical bezel area located outside of the first optical area, and a normal area located outside of the first optical bezel area. Each of the first optical area, the first optical bezel area, and the normal area comprises two or more light emitting areas among the plurality of light emitting areas, and the first optical area is a transmittable area. The plurality of light emitting areas include: a first light emitting area included in the first optical area and configured to emit light of a color; a second light emitting area configured to emit light of the same color as the first light emitting area and included in the first optical bezel area; and a third light emitting area configured to emit light of the same color as the first light emitting area and included in the normal area. The second light emitting area has a substantially same area as each of the first light emitting area and the third light emitting area, or has a different area within a first predetermined range from each of the first light emitting area and the third light emitting area.

The foregoing and other described embodiments can each include one or more of the following features:

A first feature, combinable with any of the previous or the following features, specifies that an arrangement of light emitting areas in the first optical area, an arrangement of light emitting areas in the first optical bezel area, and an arrangement of light emitting areas in the normal area are substantially same to one another.

A second feature, combinable with any of the previous or the following features, specifies that the two or more light emitting areas included in each of the first optical area, the first optical bezel area, and the normal area include: a first color light emitting area configured to emit light of a first color; a second color light emitting area configured to emit light of a second color; and a third color light emitting area configured to emit light of a third color, and specifies that in each of the first optical area, the first optical bezel area, and the normal area, at least one of the first color light emitting area, the second color light emitting area, and the third color light emitting area has a different area from another one or more light emitting areas of the first color light emitting area, the second color light emitting area, and the third color light emitting area.

A third feature, combinable with any of the previous or the following features, specifies that the first optical bezel area is disposed outside of at least a portion of an edge of the first optical area.

A fourth feature, combinable with any of the previous or the following features, specifies that the first optical bezel area has a ring shape surrounding the first optical area.

A fifth feature, combinable with any of the previous or the following features, specifies that the first optical bezel area and the normal area each includes one or more transistors disposed therein, and the first optical area does not include a transistor.

A sixth feature, combinable with any of the previous or the following features, specifies that the display device further includes: a first light emitting element disposed in the first optical area and having the first light emitting area; a second light emitting element disposed in the first optical bezel area and having the second light emitting area; a third light emitting element disposed in the normal area and having the third light emitting area; a first subpixel circuit configured to drive the first light emitting element; a second subpixel circuit configured to drive the second light emitting element; and a third subpixel circuit configured to drive the third light emitting element. The second subpixel circuit is disposed in the first optical bezel area, the third subpixel circuit is disposed in the normal area where the third light emitting element is disposed, and the first subpixel circuit is disposed in the first optical bezel area.

A seventh feature, combinable with any of the previous or the following features, specifies that the plurality of light emitting areas further includes a fourth light emitting area configured to emit light of the same color as the first light emitting area and included in the first optical area. The fourth light emitting area has a substantially same area as each of the first light emitting area, the second light emitting area, and the third light emitting area, or has a different area within a second predetermined range from each of the first light emitting area, the second light emitting area, or the third light emitting area. The fourth light emitting area is disposed adjacent to the first light emitting area in a row direction or a column direction.

An eighth feature, combinable with any of the previous or the following features, specifies that the display device further includes: a fourth light emitting element disposed in the first optical area and having the fourth light emitting area; and a fourth subpixel circuit configured to drive the fourth light emitting element and disposed in the first optical bezel area.

A nineth feature, combinable with any of the previous or the following features, specifies that the display device further includes a fourth light emitting element disposed in the first optical area and having the fourth light emitting area. The first subpixel circuit is configured to drive the first light emitting element and the fourth light emitting element disposed in the first optical area.

A tenth feature, combinable with any of the previous or the following features, specifies that the display device further includes an anode extension line electrically connecting the first light emitting element to the first subpixel circuit. At least a portion of the anode extension line is disposed in the first optical area, and the anode extension line includes a transparent material.

An eleventh feature, combinable with any of the previous or the following features, specifies that the display device further includes: a first anode electrode disposed in the first optical area; a second anode electrode disposed in the first optical bezel area; a third anode electrode disposed in the normal area; and a cathode electrode that extends in the first optical area, the first optical bezel area, and the normal area. The first light emitting element includes the first anode electrode and the cathode electrode; the second light emitting element includes the second anode electrode and the cathode electrode; the third light emitting element includes the third anode electrode and the cathode electrode; and the cathode electrode includes one or more cathode holes located in the first optical area.

A twelfth feature, combinable with any of the previous or the following features, specifies that the display device further includes: a bank disposed on the first anode electrode and including a bank hole exposing a portion of the first anode electrode; and an emission layer disposed on the bank and in contact with the portion of the first anode electrode exposed through the bank hole. The bank hole offsets from each of the one or more cathode holes, and one or more portions of an upper surface of the bank that overlap the one or more cathode holes are flat.

A thirteenth feature, combinable with any of the previous or the following features, specifies that the first subpixel circuit includes a first driving transistor disposed in the first optical bezel area and configured to drive the first light emitting element disposed in the first optical area; the second subpixel circuit includes a second driving transistor disposed in the first optical bezel area and configured to drive the second light emitting element disposed in the first optical bezel area; and the display device further include: a first planarization layer disposed on the first driving transistor and the second driving transistor; a first relay electrode disposed on the first planarization layer and electrically connected to a first source electrode of the first driving transistor through a first hole formed in the first planarization layer; a second relay electrode disposed on the first planarization layer and electrically connected to a second source electrode of the second driving transistor through a second hole formed in the first planarization layer; a second planarization layer disposed on the first relay electrode and the second relay electrode; and an anode extension line connecting between the first relay electrode and the first anode electrode and located on the first planarization layer. The second anode electrode is electrically connected to the second relay electrode through a third hole formed in the second planarization layer, and the first anode electrode is electrically connected to the anode extension line through a fourth hole formed in the second planarization layer, and at least a portion of the anode extension line is disposed in the first optical area, and includes a transparent material.

A fourteenth feature, combinable with any of the previous or the following features, specifies that the display device further includes a fourth light emitting element in the first optical area. The anode extension line overlaps a cathode hole of the one or more cathode holes, which is located between the first light emitting element and the fourth light emitting element, and the first light emitting area of the first light emitting element and a fourth light emitting area of the fourth light emitting element are configured to emit light of the same color.

A fifteenth feature, combinable with any of the previous or the following features, specifies that the anode extension line is further electrically connected to an anode electrode different from the first anode electrode.

A sixteenth feature, combinable with any of the previous or the following features, specifies that the first subpixel circuit includes a first driving transistor for driving the first light emitting element, and the second subpixel circuit includes a second driving transistor for driving the second light emitting element, and a first active layer of the first driving transistor and a second active layer of the second driving transistor are located in different layers.

A seventeenth feature, combinable with any of the previous or the following features, specifies that the display device further includes: a substrate; a first buffer layer disposed between the substrate and the first driving transistor; and a second buffer layer disposed between the first driving transistor and the second driving transistor.

A eighteenth feature, combinable with any of the previous or the following features, specifies that the first active layer of the first driving transistor and the second active layer of the second driving transistor include different semiconductor materials.

A nineteenth feature, combinable with any of the previous or the following features, specifies that the display area further includes a second optical area, and the second optical area includes two or more transmission areas and two or more light emitting areas, and an area of each of the two or more light emitting areas included in the second optical area is substantially the same as, or different within a predetermined range from, an area of the first light emitting area included in the first optical area.

A twentieth feature, combinable with any of the previous or the following features, specifies that the first optical area does not include a transistor, and the second optical area includes one or more transistors disposed therein.

A twenty first feature, combinable with any of the previous or the following features, specifies that the display device further includes: a fifth light emitting element disposed in the second optical area; and a fifth subpixel circuit configured to drive the fifth light emitting element and overlapping at least a portion of the fifth light emitting element in the second optical area.

A twenty second feature, combinable with any of the previous or the following features, specifies that the display device further includes: a first optical electronic device overlapping the first optical area; and a second optical electronic device overlapping the second optical area. The first optical electronic device is a camera, and the second optical electronic device is a sensor different from the camera.

A twenty third feature, combinable with any of the previous or the following features, specifies that the display device further includes: an encapsulation layer on the first light emitting area, the second light emitting area, and the third light emitting area; and a touch sensor metal on the encapsulation layer. The touch sensor metal is disposed in the normal area and the first optical bezel area.

In a second implementation, a display panel includes: a display area having a first optical area, a first optical bezel area located outside of the first optical area, and a normal area located outside of the first optical bezel area, the display area configured to display an image; and a non-display area not configured to display an image. Each of the first optical area, the first optical bezel area, and the normal area includes a plurality of light emitting areas, and the first optical area includes a plurality of transmission areas. The first optical area includes a first light emitting element having a first light emitting area. The first optical bezel area includes a second light emitting element having a second light emitting area. The first optical bezel area further includes a first subpixel circuit configured to drive the first light emitting element and a second subpixel circuit configured to drive the second light emitting element. The display panel further includes an anode extension line electrically connecting the first light emitting element in the first optical area to the first subpixel circuit in the first optical bezel area. At least a portion of the anode extension line overlaps the first optical area, and includes a transparent material.

A twenty fourth feature, combinable with any of the previous or the following features, specifies that the normal area includes a third light emitting element having a third light emitting area and a third subpixel circuit configured to drive the third light emitting element, the first light emitting element, the second light emitting element, and the third light emitting element configured to emit light of a same color, the third light emitting area has substantially a same area size as each of the first light emitting area or the second light emitting area, or may have a different area size within a predetermined range from each of the first light emitting area or the second light emitting area.

In a third implementation, a display panel includes: a plurality of light emitting elements for displaying an image; and an optical electronic device for receiving ambient light. Each of the plurality of light emitting elements include a cathode electrode, an emission layer and an anode electrode, cathode electrodes of the plurality of light emitting elements being in a single continuous cathode material layer, the single continuous cathode material layer including a plurality of local openings. The continuous cathode material layer is at a first side of the emission layer. The optical electronic device and the anode electrode are at a second side of the emission layer opposite to the first side. The anode electrode is between the emission layer and the optical electronic device. Each local opening of the plurality of local openings is disposed to face a portion of the optical electronic device, the local opening configured to facilitate ambient light incident to reach the optical electronic device through the local opening.

In a fourth implementation, a display device includes: a display area for displaying an image and including a plurality of light emitting areas. The display area includes a first optical area, a first optical bezel area located outside of the first optical area, and a normal area located outside of the first optical bezel area. Each of the first optical area, the first optical bezel area, and the normal area includes two or more light emitting areas among the plurality of light emitting areas, and the first optical area is a transmittable area. The plurality of light emitting areas include: a first light emitting area configured to emit light of a color and included in the first optical area; a second light emitting area configured to emit light of the same color as the first light emitting area and included in the first optical bezel area; and a third light emitting area configured to emit light of the same color as the first light emitting area and included in the normal area.

The first light emitting area, the second light emitting area and the third light emitting area have substantially a same area.

In a fifth implementation, a display panel includes: a display area having a first optical area, a first optical bezel area located outside of the first optical area, and a normal area located outside of the first optical bezel area, and allowing an image to be displayed. Each of the first optical area, the first optical bezel area, and the normal area includes a plurality of light emitting areas, and the first optical area includes a plurality of transmission areas. The first optical area includes a first light emitting element having a first light emitting area, and the first optical bezel area includes a second light emitting element having a second light emitting area. The first optical bezel area further includes a first subpixel circuit configured to drive the first light emitting element and a second subpixel circuit configured to drive the second light emitting element. The display panel further includes an anode extension line that electrically connects the first light emitting element in the first optical area to the first subpixel circuit in the first optical bezel area. At least a portion of the anode extension line overlaps the first optical area, and includes a transparent material.

In a sixth implementation, a display device includes: a first anode electrode in a first display area; a second anode electrode in a second display area; a cathode electrode extending in both the first display area and the second display area; one or more holes in the cathode electrode in the first display area; a first driving transistor in the second display area and connected to the first anode electrode; and a second driving transistor in the second display area and connected to the second anode electrode.

A twenty fifth feature, combinable with any of the previous or the following features, specifies that the first driving transistor is on a first semiconductor layer, the second driving transistor is on a second semiconductor layer, and the first semiconductor layer is vertically separated from the second semiconductor layer by a dielectric layer.

A twenty sixth feature, combinable with any of the previous or the following features, specifies that the cathode electrode does not include a hole in the second display area.

A twenty seventh feature, combinable with any of the previous or the following features, specifies that the one or more holes each offsets from the first anode electrode.

A twenty eighth feature, combinable with any of the previous or the following features, specifies that the display device further include a light emission layer on the first anode, wherein the one or more holes each overlaps the light emission layer.

A twenty nineth feature, combinable with any of the previous or the following features, specifies that the display device further includes a third anode electrode in the first display area, wherein a hole of the one or more holes is positioned between the first anode electrode and the third anode electrode.

A thirtieth feature, combinable with any of the previous or the following features, specifies that the first driving transistor is connected to the third anode electrode.

The above description has been presented to enable any person skilled in the art to make and use the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. Although the example embodiments have been described for illustrative purposes, a person skilled in the art will appreciate that various modifications and applications are possible without departing from the essential characteristics of the present disclosure. For example, the specific components of the example embodiments may be variously modified. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope appreciated by reviewing the embodiments described herein. The scope of protection of the present disclosure is to be construed according to the claims, and all technical ideas within the scope of the claims should be interpreted as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:

a first area including a first plurality of light emitting areas, the first plurality of light emitting areas including a first density; and a second area adjacent to the first area, the second area including a second plurality of light emitting areas and a plurality of touch sensing metal elements, the second plurality of light emitting areas including a second density that is different from the first density, the second plurality of light emitting areas sharing an electrode layer with the first plurality of light emitting areas, and the plurality of touch sensing metal elements being disposed on the electrode layer, wherein the plurality of touch sensing metal elements are disposed on the second plurality of light emitting areas and the plurality of touch sensing metal elements do not overlap the second plurality of light emitting areas.

2. The display device of claim 1, further comprising one or more bridging metal elements, each of the one or more bridging metal elements connecting two or more of the touch sensing metal elements.

3. The display device of claim 2, further comprising a dielectric layer between the plurality of touching sensing metal elements and the one or more bridging metal elements.

4. The display device of claim 1, wherein:

the first plurality of light emitting areas includes a first light emitting area configured to emit light of a first color, the second plurality of light emitting areas includes a second light emitting area configured to emit light of the first color, and the first light emitting area has substantially a same area as the second light emitting area.

5. The display device of claim 1, wherein the first light emitting area has substantially a same shape as the second light emitting area.

6. The display device of claim 1, wherein the second area includes one or more transistors disposed therein, and the first area does not include a transistor.

7. The display device of claim 1, comprising a connection structure extending across a border between the first area and the second area.

8. The display device of claim 7, wherein the connection structure is connected to a transistor in the second area, and is connected to an organic light emitting diode in the first area.

9. The display device of claim 8, wherein the connection structure overlaps an anode of the organic light emitting diode in the first area.

10. A display device, comprising a first area including a first plurality of light emitting areas;

a second area adjacent to the first area, the second area including a second plurality of light emitting areas, a plurality of touch sensing metal elements and a first plurality of transistors, the first plurality of transistors including a first transistor having a first semiconductor layer of a first semiconductor material and a second transistor having a second semiconductor layer of a second semiconductor material that is different from the first semiconductor material, the second semiconductor layer at a different level from the first semiconductor layer;

a third area adjacent to the second area, the third area including a third plurality of light emitting areas and a second plurality of transistors, the second plurality of transistors including a third transistor having a third semiconductor layer of the first semiconductor material and a fourth transistor having a fourth semiconductor layer of the second semiconductor material, the fourth semiconductor layer at a different level from the third semiconductor layer, a connection structure extending across a border between the first area and the second area, wherein the plurality of touch sensing metal elements are disposed on the second plurality of light emitting areas and the plurality of touch sensing metal elements do not overlap the second plurality of light emitting areas.

11. The display device of claim 10, wherein a light emitting area of the first plurality of light emitting areas includes an organic light emitting diode, the organic light emitting diode having a cathode, an anode, and an emission layer between the cathode and the anode, wherein the connection structure overlaps with the anode electrode of the organic light emitting diode.

12. The display device of claim 11, wherein the connection structure includes a transparent material.

13. The display device of claim 11, comprising a dielectric layer on the connection structure, wherein the anode electrode and the connection structure is connected by an interconnection portion that extends through the dielectric layer.

14. The display device of claim 13, wherein the interconnection portion has a same material as the anode electrode.

15. The display device of claim 10, comprising a cathode layer that extends among the first plurality of light emitting areas and the second plurality of light emitting areas, the cathode layer including one or more cathode holes in the first area.

16. A display device, comprising a first area including a first plurality of light emitting areas on a substrate structure;

a second area on the substrate structure and adjacent to the first area, the second area including a second plurality of light emitting areas, a plurality of touch sensing metal elements and a first plurality of transistors, the first plurality of transistors including a first transistor having a first semiconductor layer of a first semiconductor material and a second transistor having a second semiconductor layer of a second semiconductor material that is different from the first semiconductor material, the second semiconductor layer at a different level from the first semiconductor layer;

a connection structure in connection with the first transistor and a light emitting area of the first plurality of light emitting areas in the first area, wherein the plurality of touch sensing metal elements are disposed on the second plurality of light emitting areas and the plurality of touch sensing metal elements do not overlap the second plurality of light emitting areas.

17. The display device of claim 16, wherein the first semiconductor material includes polysilicon, and the second semiconductor material includes an oxide semiconductor material.

18. The display device of claim 16, wherein the substrate structure includes a first substrate layer, a second substrate layer, and an insulation layer is between the first substrate and the second substrate.

19. A display device, comprising an optical device;

a substrate having a first area, a second area, and a third area, the first area overlapping with the optical device, the substrate including a first substrate layer of an organic material, a second substrate layer of an organic material and an interlayer of an inorganic material between the first substrate layer and the second substrate layer;

a first transistor layer on the substrate and in the second and the third area;

a second transistor layer on the first transistor layer in the second and the third area;

a planarization layer on the second transistor layer;

a light emitting layer on the planarization layer;

a passivation layer on the light emitting layer; and a touch sensing layer on the passivation layer, wherein the second area includes transistors of a first density, the third area includes transistors of a second density that is different from the first density.

* * * * *